United States Patent [19]
McCallister et al.

[11] Patent Number: 6,097,764
[45] Date of Patent: Aug. 1, 2000

[54] PRAGMATIC TRELLIS-CODED MODULATION SYSTEM AND METHOD THEREFOR

[75] Inventors: Ronald D. McCallister, Scottsdale; Bruce A. Cochran, Mesa; John M. Liebetreu, Scottsdale, all of Ariz.

[73] Assignee: Sicom, Inc., Scottsdale, Ariz.

[21] Appl. No.: 09/048,612

[22] Filed: Mar. 26, 1998

Related U.S. Application Data

[63] Continuation-in-part of application No. 08/991,385, Dec. 16, 1997.

[51] Int. Cl.[7] .................................................. H03M 13/12
[52] U.S. Cl. ........................... 375/298; 375/261; 371/43.1
[58] Field of Search ..................... 375/261, 262, 375/265, 295, 298; 371/37.4, 43.1, 43.4

[56] References Cited

U.S. PATENT DOCUMENTS

| | | | |
|---|---|---|---|
| 4,500,994 | 2/1985 | McCallister et al. | 371/43 |
| 4,601,044 | 7/1986 | Kromer, III et al. | 375/17 |
| 4,980,897 | 12/1990 | Decker et al. | 375/265 |
| 4,993,046 | 2/1991 | Saito et al. | 375/39 |
| 5,233,629 | 8/1993 | Paik et al. | 375/39 |
| 5,233,630 | 8/1993 | Wolf | 375/67 |
| 5,363,408 | 11/1994 | Paik et al. | 375/261 |
| 5,396,518 | 3/1995 | How | 375/265 |
| 5,408,502 | 4/1995 | How | 375/340 |
| 5,428,631 | 6/1995 | Zehavi | 371/43 |
| 5,442,626 | 8/1995 | Wei | 370/207 |
| 5,469,452 | 11/1995 | Zehavi | 371/43 |
| 5,511,096 | 4/1996 | Huang et al. | 375/265 |
| 5,535,228 | 7/1996 | Dong et al. | 371/49.1 |
| 5,621,761 | 4/1997 | Heegard | 375/265 |
| 5,621,762 | 4/1997 | Miller et al. | 375/298 |
| 5,633,881 | 5/1997 | Zehavi et al. | 371/37.5 |
| 5,651,032 | 7/1997 | Okita | 375/341 |
| 5,790,570 | 8/1998 | Heegard et al. | 371/37.4 |
| 5,848,102 | 12/1998 | Zehavi et al. | 375/261 |

OTHER PUBLICATIONS

C. Melvil Thomas, Michael Y. Weidner and S.H. Durrani, "Digital Amplitude–Phase Keying with M–ary Alphabets", IEEE Transactions on Communications Feb. 1974, vol. Com–22, No. 2, pp. 168–179.

Viterbi, et al. "A Pragmatic Approach to Trellis–Coded Modulation", IEEE Communications Magazine, Jul. 1989, pp. 11–19.

Wolf and Zehavi, "P[2] Codes: Pragmatic Trellis Codes Utilizing Punctured Convolutional Codes", IEEE Communications Magazine, Feb. 1995, pp. 94–99.

Washio, et al., "Experimental Study on a New 1.6GPBS 16–Level APSK Modem", NTC '77 Conference Record, vol. I.

*Primary Examiner*—Young T. Tse
*Attorney, Agent, or Firm*—Meschkow & Gresham, P.L.C.; Lowell W. Gresham; Jordan M. Meschkow

[57] ABSTRACT

A digital communication system (20) communicates using a polar amplitude phase shift keyed (P-APSK) phase point constellation (70, 70', 70"). Pragmatic encoding is accommodated using the constellation (70, 70', 70") to simultaneously communicate both encoded and uncoded information bits (69, 51). The constellation (70, 70', 70") has an even number of phase point rings (74) and equal numbers of phase points (72) in ring pairs (75, 76, 77). Encoded information bits (69) specify secondary modulation and uncoded information bits (51) specify primary modulation. The constellation (70, 70', 70") is configured so secondary sub-constellations (78) include four phase points (72) arranged so that two of the four phase points (72) exhibit two phase angles at one magnitude and the other two of the four phase points (72) exhibit phase angles that are at another magnitude. The difference between the phase angles at different magnitudes within a secondary sub-constellation (78) is constant.

19 Claims, 13 Drawing Sheets

6,097,764

1

PRAGMATIC TRELLIS-CODED MODULATION SYSTEM AND METHOD THEREFOR

RELATED INVENTION

The present invention is a continuation in part (CIP) of "Data Communication System and Method Therefor," Ser. No. 08/991,385, filed Dec. 16, 1997, which is incorporated by reference herein.

TECHNICAL FIELD OF THE INVENTION

The present invention relates generally to the field of digital communications. More specifically, the present invention relates to pragmatic trellis-coded modulators for digital communications.

BACKGROUND OF THE INVENTION

Pragmatic trellis coded modulation (PTCM) employs primary and secondary modulation schemes. A first set of information bits being communicated is processed by the primary modulation scheme, and a second set of communicated information bits is processed by the secondary modulation scheme. Differential encoding may optionally be applied independently to the first and second sets of information bits to help a receiving decoder resolve rotational ambiguities. The secondary modulation scheme encodes the second set of information bits, which is optionally differentially encoded, with a strong error detection and correction code, such as the well known K=7, rate 1/2 "Viterbi" convolutional code (i.e., Viterbi encoding). The primary modulation scheme need not encode its subset of the information bits, other than the optional differential encoding. The resulting first and second sets of bits are then concurrently PSK or APSK mapped to generate quadrature components of a transmit signal.

The symbol data are conveyed through the phase (PSK) or amplitude and phase (APSK) relationships between the quadrature components of the transmit signal. The PSK or APSK mapping causes the phase constellation to be perturbed more by the primary modulation than by the secondary modulation.

PTCM has become popular because it allows a single convolutional encoder and decoder to achieve respectable coding gains for a wide range of bandwidth efficiencies (e.g., 1–6 b/s/Hz) and a wide range of higher order coding applications, such as 8-PSK, 16-PSK, 16-QAM, 32-QAM, etc. For lower order coding applications, such as QPSK or BPSK, PTCM offers no advantage because quadrature, complex communication signals provide two independent dimensions (i.e., I and Q) per unit baud interval with which to convey two or fewer symbols per unit interval.

APSK modulation achieves performance improvements over an otherwise equivalently ordered PSK modulation. A prior art sixteen phase-point rectilinear APSK (sixteen R-APSK) constellation 10 is shown in FIG. 1. Constellation 10 and other R-APSK modulations are conventionally referred to as quadrature amplitude modulation (QAM), but will be referred to herein using the generic term "R-APSK" to distinguish them from polar APSK (P-APSK) modulations, discussed below.

R-APSK constellations represent a special class of constellations where one set of symbols is conveyed independently of another set of symbols. In sixteen R-APSK (i.e., 16-QAM), two symbols are communicated using I-axis constellation perturbations and two symbols are communi-

2 cated using Q-axis constellation perturbations. Since the I and Q axes are orthogonal, the two sets of symbols have no influence over one another.

PTCM has been adapted to R-APSK constellations with moderate success. Typically, one primary modulation symbol and one secondary modulation symbol are conveyed by perturbations about each of the I and Q axes. Unfortunately, conventional R-APSK constellations do not achieve rotationally invariant communication systems without accepting a tremendous degradation in performance (e.g., 4 dB). Without rotational invariance, the duration required for a decoder to achieve synchronization is much longer than with rotational invariance. When rotational invariance is sacrificed, conventional R-APSK constellations achieve acceptable performance, but performance is still not optimized.

FIG. 1 denotes a primary sub-constellation 12 included in the exemplary sixteen R-APSK constellation 10. Each primary sub-constellation 12 shares a common data value for the second set of information bits being communicated (i.e., the secondary modulation). Those skilled in the art will appreciate that constellation 10 actually includes four primary sub-constellations 12. FIG. 1 further denotes a single minimum secondary sub-constellation Euclidean distance 14 and a single minimum primary sub-constellation Euclidean distance 16 for the sixteen R-APSK example. Minimum secondary distance 14 is the smallest distance between phase points in constellation 10. Minimum primary distance 16 is the smallest distance between phase points in any given primary sub-constellation 12.

The value of these minimum distances has a large influence on respective secondary modulation and primary modulation performance. One reason R-APSK communication systems do not demonstrate better performance is believed to be that these distances result from discrete, independent I, Q values which dictate the positions of the phase points in constellation 10. For example, constellation 10 is achieved when phase points have I and Q coordinates consisting of all sixteen combinations of ±1 and ±3, scaled by a factor of $1/(3\sqrt{2})$. Minimum secondary distance 14 is $2/(3\sqrt{2})$, and minimum primary distance 16 is $4/(3\sqrt{+e,fra 2+ee})$. As a result, the performance of primary modulation is not balanced with that of secondary modulation unless signal-to-noise ratio is held at a single specific value, and overall performance suffers.

Furthermore, conventional applications of PTCM to R-APSK constellations provide an excessive number of phase points at the respective minimum distances from other phase points. For the sixteen R-APSK example depicted in FIG. 1, four minimum primary sub-constellation Euclidean distances 16 exist for each of the four primary sub-constellations 12, resulting in a total of 16 minimum primary sub-constellation Euclidean distances 16 in constellation 10. This large number of minimum primary sub-constellation Euclidean distances 16 causes primary modulation performance to suffer. Likewise, for the sixteen R-APSK example depicted in FIG. 1, twenty-four minimum secondary sub-constellation Euclidean distances 14 exist in constellation 10. These twenty four minimum secondary sub-constellation Euclidean distances 14 operate in combination with the strength of a particular convolutional code to greatly influence secondary modulation performance.

Moreover, R-APSK constellations are particularly undesirably when used on peak power limited channels, such as characterize satellite communications. As illustrated by FIG. 1 for a specific sixteen R-APSK constellation, phase points reside in three concentric rings 18. Peak transmitter power is required to transmit phase points on the outer ring 18'. In random data, only ¼ of the data are transmitted at this peak power. Accordingly, the peak power capability that must be provided in the transmitter is used to transmit only ¼ of the data, resulting in an inefficient use of the peak power capability. In general, R-APSK constellations require an excessive number of phase points rings 18 for a given number of phase points in the constellation, and this excessive number of rings 18 causes an inefficient use of transmitter power so that an undesirably low amount of power is transmitted per bit.

Moreover, transmitter amplifiers introduce AM-AM and AM-PM distortions in the signals they amplify. AM-AM distortions characterize non-linear amplitude variations in an amplifier output signal which occur as a function of input amplitude but are not explained by amplifier gain. AM-PM distortions characterize phase variations in an amplifier output signal which occur as a function of input amplitude. The use of an excessive number of rings 18 in R-APSK for a given number of phase points requires transmitter amplifiers to operate at an excessive number of input amplitude states and causes an excessive amount of AM-AM and AM-PM distortions.

In theory, P-APSK constellations should have superior characteristics to R-APSK constellations, particularly in peak power limited channels. P-APSK constellations can be arranged so that a greater percentage of random data is transmitted using the peak power to achieve transmitter amplifier utilization efficiency. In addition, AM-AM and AM-PM distortions can theoretically be reduced if fewer rings are used to implement a phase constellation when compared to a R-APSK constellation having an equivalent number of phase points.

Unfortunately, conventional P-APSK constellations are not adapted to PTCM communication systems. Accordingly, such constellations have been proposed in either uncoded or in fully coded applications. Uncoded applications apply no convolutional coding to the communicated information bits, and fully coded applications apply convolutional coding to all communicated information bits. Uncoded applications are highly undesirable because they demonstrate significantly degraded performance when compared with equivalent pragmatic or fully coded applications. Fully coded applications are undesirable because they require the use of different convolutional encoders and decoders for different modulation orders.

SUMMARY OF THE INVENTION

Accordingly, it is an advantage of the present invention that an improved pragmatic trellis-coded modulator and method for a data communication system are provided.

Another advantage of the present invention is that a phase point constellation is provided which is suitable for PTCM communication schemes.

Another advantage of the present invention is that a P-APSK constellation is provided which is suitable for use in peak power limited channels.

Another advantage of the present invention is that a P-APSK constellation is provided for which minimum primary sub-constellation Euclidean distances are maximized while the quantity of such distances is minimized.

Another advantage is that a PTCM data communication system and method are provided which rely upon dependent encoded symbols.

The above and other advantages of the present invention are carried out in one form by a pragmatic trellis-coded modulator. The modulator includes a parsing circuit, a convolutional encoding circuit coupled to the parsing circuit, and a polar amplitude phase shift keyed (P-APSK) mapping circuit coupled to the parsing circuit and the convolutional encoding circuit. The parsing circuit parses input information bits into uncoded information bits and to-be-coded information bits. The convolutional encoding circuit produces at least two encoded information bits for each to-be-coded information bit processed therein per unit interval of time. The P-APSK mapping circuit accepts, per unit interval of time, at least two uncoded information bits from the parsing circuit and at least two encoded information bits from the convolutional encoding circuit, maps the accepted information bits to a mapped phase point within a constellation of phase points arranged in at least two adjacent concentric rings, the outermost pair of which possesses a like predetermined number of phase points per ring, and provides a quadrature signal defining the mapped phase point.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 2:
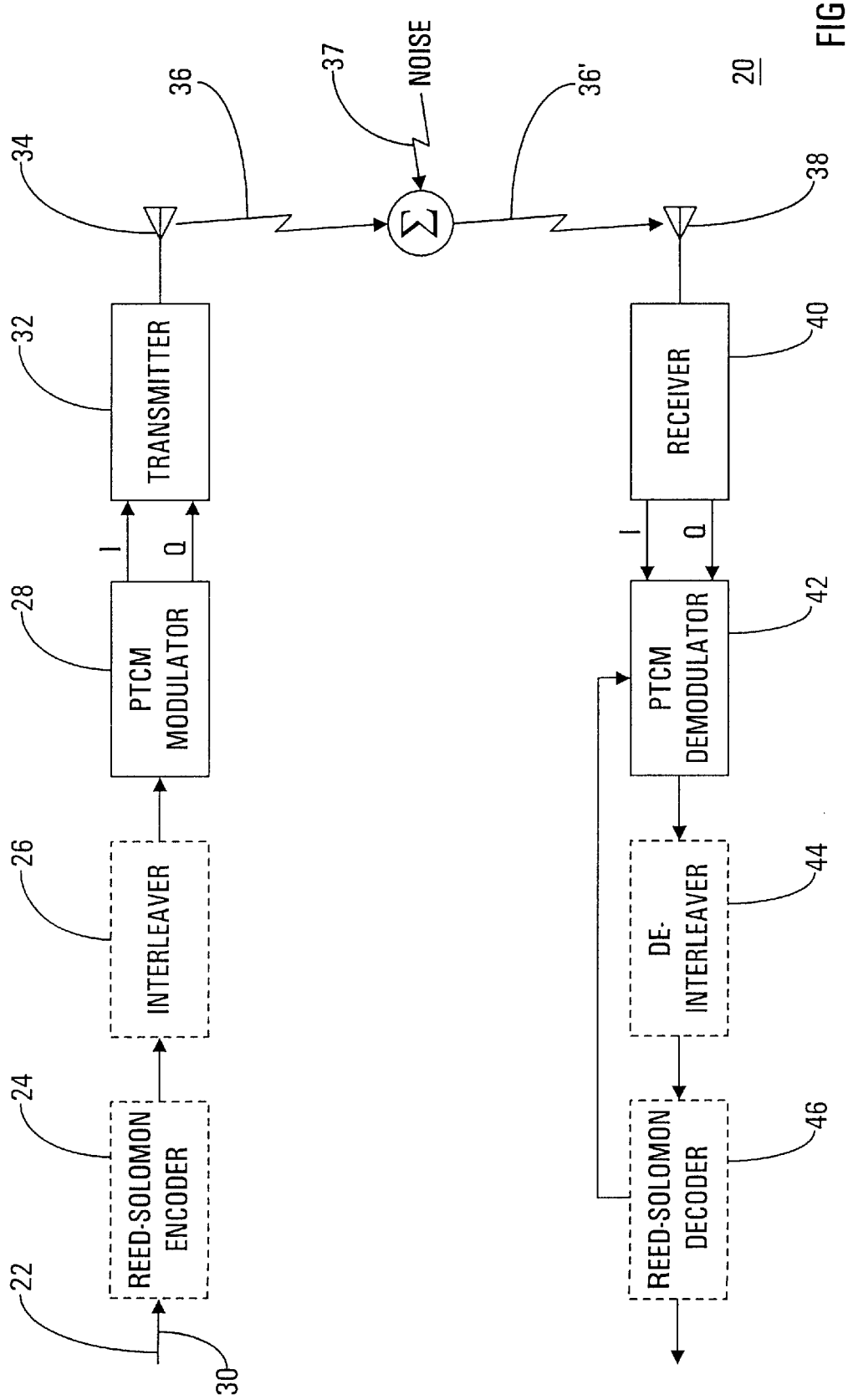
FIG. 2 shows a block diagram of a digital communication system configured in accordance with the teaching of the present invention.

FIG. 2 shows a block diagram of a digital communication system 20 configured in accordance with the teaching of the present invention. At a supply point 22, system 20 receives information bits or user data to be transmitted. In one embodiment of the present invention, concatenated coding is implemented. Accordingly, in this embodiment supply point 22 couples to an input of a Reed-Solomon or other block encoder 24. An output of Reed-Solomon encoder 24 couples to an input of an interleaver 26, and an output of interleaver 26 couples to an input of a pragmatic trellis coded modulation (PTCM) modulator 28. In another embodiment of the present invention, concatenated coding is omitted, and information bits are applied directly to PTCM modulator 28. For convenience, the data supplied to PTCM modulator 28 are referred to herein as input information bits 30 regardless of whether concatenated coding is implemented. PTCM modulator 28 is discussed in more detail below in connection with FIGS. 3 through 11.

PTCM modulator 28 generates phase point data that may be in the form of I and Q quadrature signals which are supplied to a transmitter 32. Transmitter 32 couples to a transmission antenna 34 from which a digital communication signal 36 is broadcast through a communication channel. As illustrated in FIG. 2, digital communication signal 36 is invariably mixed with and corrupted to some degree by noise 37 within the communication channel. The resultant corrupted digital communication signal 36' is received at a reception antenna 38 which couples to an input of a receiver 40. In the preferred embodiments, receiver 40 implements a carrier-coherent reception scheme. Receiver 40 produces rectilinear (i.e. I and Q) or polar (i.e., $\phi$ and M, not shown) quadrature components which are then supplied to a PTCM demodulator 42.

PTCM demodulator 42 generates estimates of input information bits 30. In one embodiment of the present invention, an output of PTCM demodulator 42 couples to an input of a deinterleaver 44, an output of which couples to an input of a Reed-Solomon or other block decoder 46. An output of Reed-Solomon decoder 46 indicating when valid data are being received is fed back to PTCM demodulator 42 to aid in achieving node synchronization (i.e., to determine frame timing).

In another embodiment, deinterleaver 44 and Reed-Solomon decoder 46 are omitted, in which case other node synchronization techniques known to those skilled in the art may be used to identify frame timing.

Figure 3:
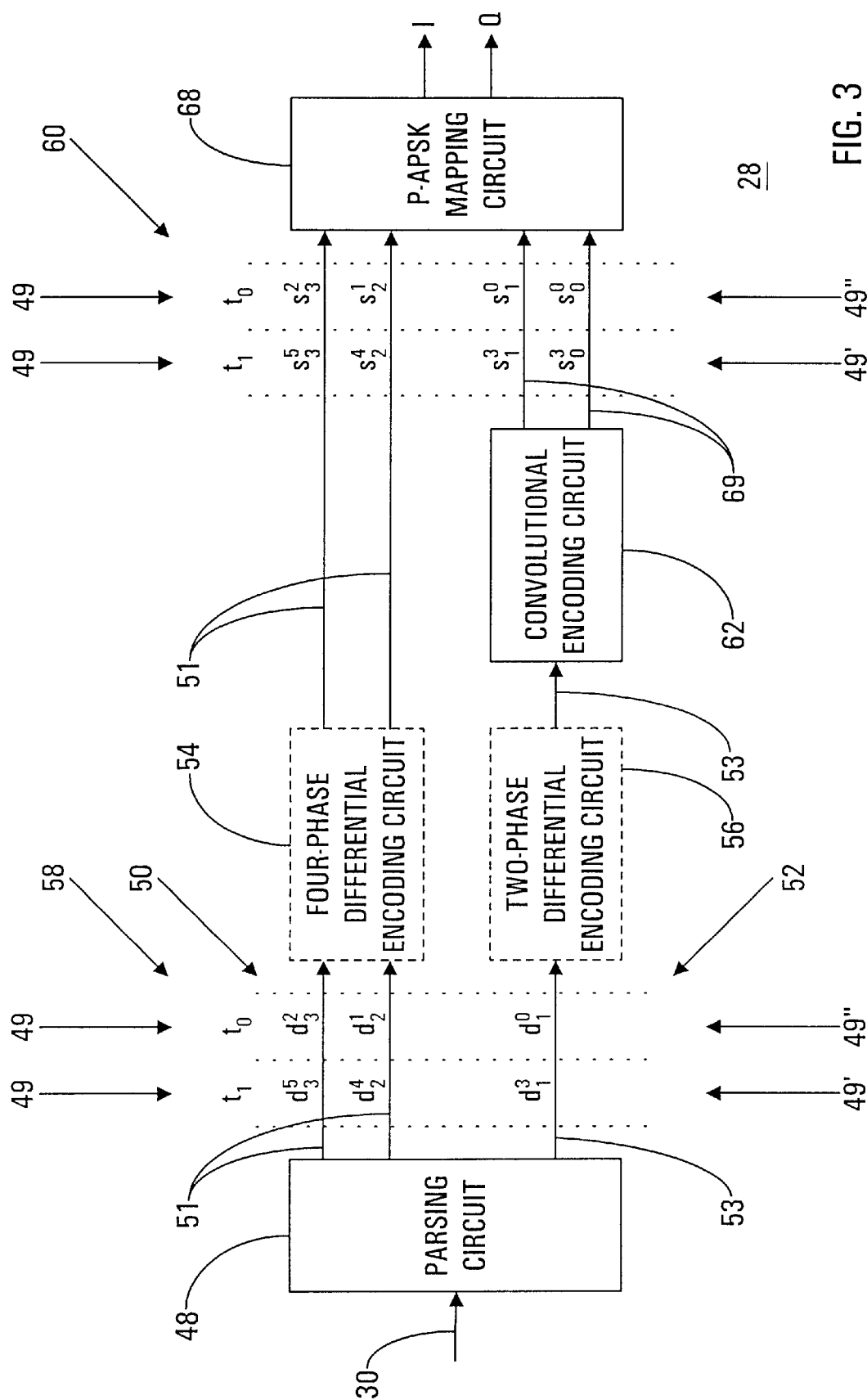
FIG. 3 shows a block diagram of a pragmatic trellis-coded modulator, as used in the communication system shown in FIG. 2.

FIG. 3 shows a block diagram of PTCM modulator 28, as used in communication system 20, in accordance with a preferred embodiment of the present invention. The following discussion refers to FIGS. 2 and 3.

A stream of input information bits 30 is applied to an input of a parsing circuit 48. Parsing circuit 48 partitions input information bits 30 between an output providing a primary stream 50 of uncoded information bits 51 and an output providing a secondary stream 52 of to-be-coded information bits 53.

In a preferred embodiment, discussed in greater detail below in conjunction with FIGS. 4–5, 7–8, and 10–11, PTCM modulator 28 produces a fully-rotationally-invariant quadrature output. In this embodiment, uncoded information bits 51 of primary stream 50 are distributed to a four-phase differential encoding circuit 54, and to-be-coded information bits 53 of secondary stream 52 are distributed to a two-phase differential encoding circuit 56.

FIG. 3 denotes uncoded information bits 51 of primary stream 50 as data (d) with a subscript of "2" or "3", and to-be-coded information bits 53 of secondary stream 52 as data (d) with a subscript of "1". As discussed in more detail below, PTCM modulator 28 applies secondary modulation to secondary information-bit stream 52 and primary modulation to primary information-bit stream 50.

In an alternative preferred embodiment, discussed in greater detail below in conjunction with FIGS. 6 and 9, PTCM modulator produces a non-fully-rotationally-invariant quadrature output. In this embodiment, differential encoding circuits 54 and 56 are omitted.

The present invention may be adapted to operate over a wide variety of modulation formats and orders and to produce a wide variety of effective code rates. However, for the sake of clarity the below-presented discussion focuses on a preferred embodiment which adapts the present invention to a sixteen P-APSK modulation format and order to achieve a 3/4 code rate. In other words, for every 3 data bits processed, 4 symbols are transmitted. Those skilled in the art will appreciate that puncturing schemes may be employed to provide other code rates, e.g., an effective code rate of 7/8 is readily achievable.

In the preferred sixteen P-APSK, rate 3/4 embodiment, parsing circuit 48 routes two of every three input information bits 30 into primary stream 50 as uncoded information bits 51 and one of every three input information bits 30 into secondary stream 52 as to-be-coded information bits 53. In particular, every zeroth input information bit 30 is routed to secondary stream 52 while every first and second input information bit 30 is routed to primary stream 50, as indicated by data (d) superscripts in FIG. 3. These three input information bits 30 are distributed by parsing circuit 48 over a period equivalent to one unit interval of time 49. A single unit interval of time 49 is indicated between vertical dotted lines 58 in FIG. 3.

A unit interval of time 49 is required by system 20 to communicate a single phase point. In this sixteen P-APSK embodiment, four symbols are communicated by a single phase point per unit interval of time 49. In a sixty-four P-APSK embodiment, which is discussed below, six symbols are communicated by a single phase point per unit interval of time 49. Unit interval of time 49 represents the reciprocal of the baud rate. Over each unit interval of time 49, the relative phase of quadrature components of digital communication signal 36 (see FIG. 1) transitions from one set of phase data (i.e., one phase point) to another.

In a fully-rotationally-invariant preferred embodiment, during every unit interval of time 49, four-phase differential encoding circuit 54 processes two uncoded information bits 51 and produces two information bits that remain uncoded except for the differential encoding applied through encoding circuit 54. A single unit interval of time 49 is indicated between vertical dotted lines 60 in FIG. 3. Encoding circuit 54 generates an output which represents the difference between the two information bits being processed during a current unit interval of time 49' ($t_1$) and the two information bits processed in a preceding unit interval of time 49" ($t_0$). These information bits produced by differential encoding circuit 54 are referred to as symbols (s).

Also in the fully-rotationally-invariant preferred embodiment, two-phase differential encoding circuit 56 processes one to-be-coded information bit 53 and produces one information bit that remains uncoded except for the differential encoding applied through encoding circuit 56. Encoding circuit 56 generates an output which represents the difference between the current information bit being processed during a current unit interval of time 49' ($t_1$) and the information bit processed during a preceding unit interval of time 49" ($t_0$).

In a fully-rotationally-invariant preferred embodiment, an input of a convolutional encoding circuit 62 couples to an output of differential encoding circuit 56. In a non-fully-rotationally-invariant preferred embodiment, four-phase differential encoding circuit 54 and two-phase differential encoding circuit 56 do not exist, and the input of convolutional encoding circuit 62 couples to the secondary-stream output of parsing circuit 48.

In the preferred embodiment, encoding circuit 62 implements a transparent, recursive, K=7, rate ½ convolutional ("Viterbi") encoder, but encoders having other parameters may also be used. Encoding circuit 62 may implement either a systematic or non-systematic code. Since encoding circuit 62 implements a rate ½ code, two symbols (s) are produced for each to-be-coded information bit 53 received from parsing circuit 48 (through differential encoding circuit 56, if included). FIG. 3 denotes the two symbols produced for each information bit processed by using the subscripts "0" and "1".

Since encoding circuit 62 implements a transparent code, a linear relationship exists between the two outputs of encoding circuit 62. In other words, if identical data streams except for one complemented bit are presented to encoding circuit 62, then encoding circuit 62 will produce corresponding symbol pairs for the data streams in which either both symbols are inverted or neither symbol is inverted.

As illustrated in FIG. 3 during a first unit interval of time ($t_0$) 49, zeroth data bit $d_1^0$ of to-be-coded information bits 53 is converted by convolutional encoding circuit 62 into symbol bits $s_1^0$ and $s_0^0$ of encoded information bits 69. Bits $s_1^0$ and $s_0^0$ of encoded information bits 69 are concurrently output from convolutional encoding circuit 62 during first unit interval of time ($t_0$) 49.

Similarly, during second unit interval of time (t1) 49', data bit $d_1^3$ of to-be-coded information bits 53 is converted by convolutional encoder 62 into symbol bits $s_1^3$ and $s_0^3$ of encoded information bits 69. Bits $s_1^3$ and $s_0^3$ are concurrently output from convolutional encoding circuit 62 during second unit interval of time ($t_1$) 49'.

Accordingly, for the rate ¾ embodiment, one to-be-coded information bit 53 is processed through convolutional encoder 62 per unit interval of time 49 to produce two encoded information bits 69 or symbols.

Uncoded information bits 51 from the primary-stream output of parsing circuit 48, or from four-phase differential encoding circuit 54, if included, couple to primary stream (uncoded) inputs of a mapping circuit 68. Similarly, encoded information bits 69 from an output of convolutional encoding circuit 62 couple to secondary stream (encoded) inputs of mapping circuit 68. In particular, during first unit interval of time ($t_0$) 49, $2^{N-2}$ information bits 51, (data bits $d_3^2$ and $d_2^1$, as symbol bits $S_3^2$ and $s_2^1$, in FIG. 3) drive the uncoded inputs of mapping circuit 68 in parallel and two encoded information bits 69 (symbol bits $S_0^0$ and $s_0^1$ in FIG. 3) drive the encoded inputs of mapping circuit 68 in parallel, where N is the modulation order. The modulation order N equals four for the sixteen P-APSK preferred embodiment depicted in FIG. 3 and equals six for the sixty-four P-APSK preferred embodiments discussed later. Accordingly, mapping circuit 68 maps four or more symbols per unit interval of time 49.

Mapping circuit 68 implements a P-APSK phase point constellation arranged as discussed below. Mapping circuit 68 is desirably implemented as a random access memory (RAM) in which uncoded and encoded inputs represent memory address inputs. Thus, each mapping operation is performed by table look-up.

Mapping circuit 68 is configured to concurrently map uncoded information bits 51 with encoded information bits 69. One mapping occurs for each unit interval of time 49. Each mapping causes a phase point to be produced. Each phase point is characterized by quadrature components which exhibit a predetermined relative magnitude and phase. During a unit interval of time 49, a phase point is processed through transmitter 32 (FIG. 2) and conveyed to receiver 40 (FIG. 2). However, the inevitable presence of noise, transmitter distortions, receiver distortions, and other factors invariably causes receiver 40 to receive a somewhat different phase point than was transmitted. Accordingly, the arrangement of phase points in a phase point constellation has a significant influence on the ability of receiver 40 to successfully recover communicated data.

Figure 4:
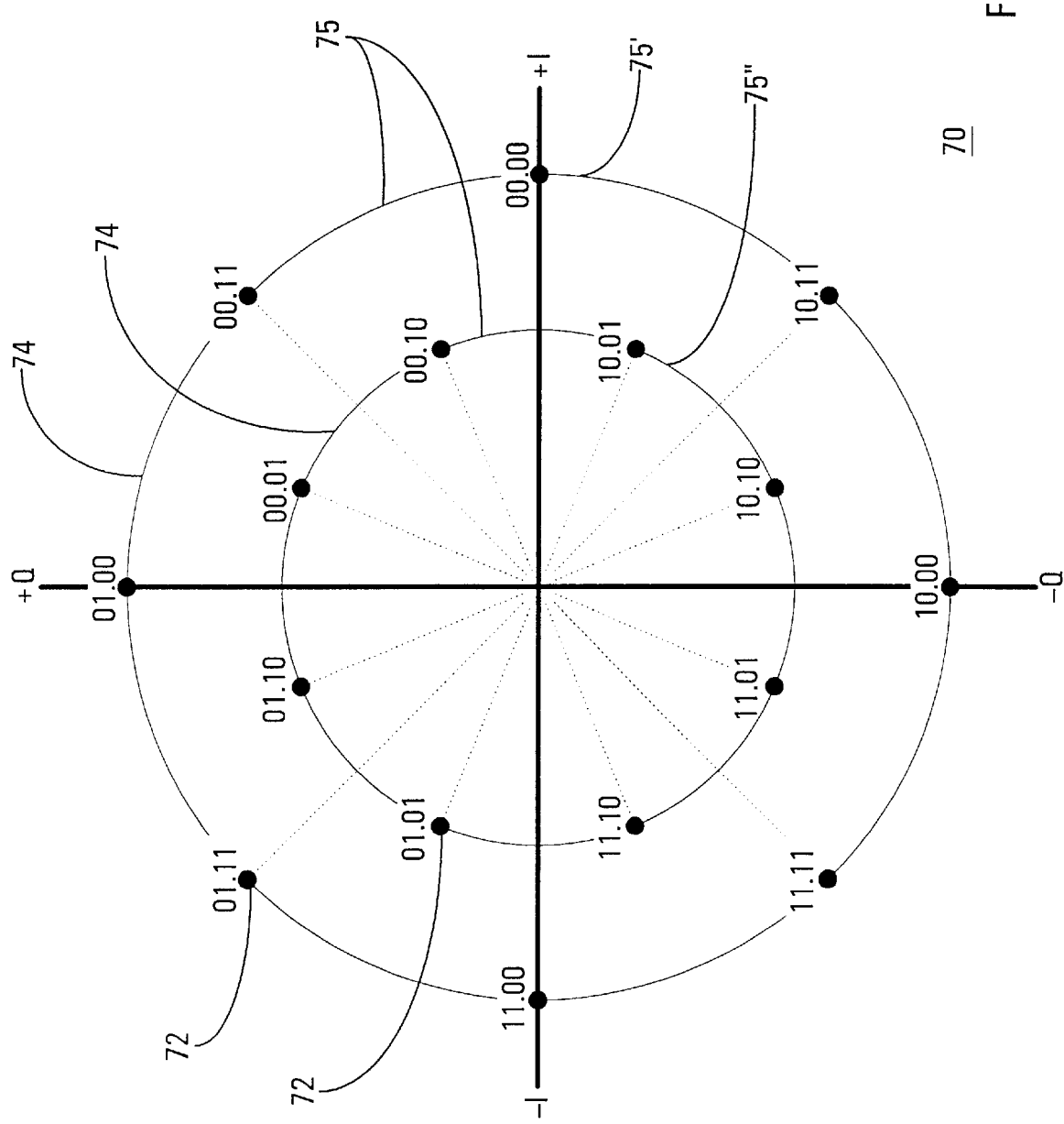
FIG. 4 shows a sixteen phase-point, polar amplitude phase shift keyed fully-rotationally-invariant (sixteen P-APSK-FRI) constellation produced by a first embodiment of a mapping circuit portion of the modulator shown in FIG. 3.

FIGS. 4 through 11 graphically illustrate P-APSK phase point constellations implemented by preferred embodiments of the present invention. FIG. 4 shows a sixteen phase-point, polar phase-shift keyed fully-rotationally-invariant (sixteen P-APSK-FRI) constellation 70 produced by a first embodiment of mapping circuit 68 (FIG. 3) in accordance with a preferred embodiment of the present invention. The following discussion refers to FIG. 4.

Constellation 70 includes phase points 72 arranged in an even number of concentric rings 74 of phase points 72. A single ring 74 includes the set of phase points 72 which have substantially equal magnitude.

Constellation 70 is derived from a QPSK constellation (not shown) for which pragmatic encoding has no benefit but which demonstrates desirable performance characteristics for uncoded or fully coded communications. A QPSK constellation (not shown) has a single ring of four phase points arranged 90° apart from adjacent phase points, implements a modulation order of two, and is used to communicate two symbols per unit interval.

Constellation 70 is derived from the QPSK constellation described above by providing four phase points 72 for each phase point in the original constellation. To do so, the QPSK ring is expanded into a first (only) ring pair 75 having like numbers of phase points 72 per ring.

For ring pair 75, the original QPSK ring becomes an outer ring 75' and an inner ring 75" is added. One phase point 72 is added to outer ring 75' for each of the four original phase points thereon to achieve a total of eight phase points 72. Two phase points 72 are provided on inner ring 75" for each of the four original phase points on outer ring 75' to achieve a total of eight phase points 72. All eight phase points 72 on each of outer ring 75' and inner ring 75" are uniformly distributed in phase, i.e., spaced 45° apart, with phase points 72 on inner ring 75" being symmetrically interleaved with and substantially bisecting the phase angles of phase points 72 on outer ring 75', i.e., rotated 22.5° with respect thereto.

Figure 5:
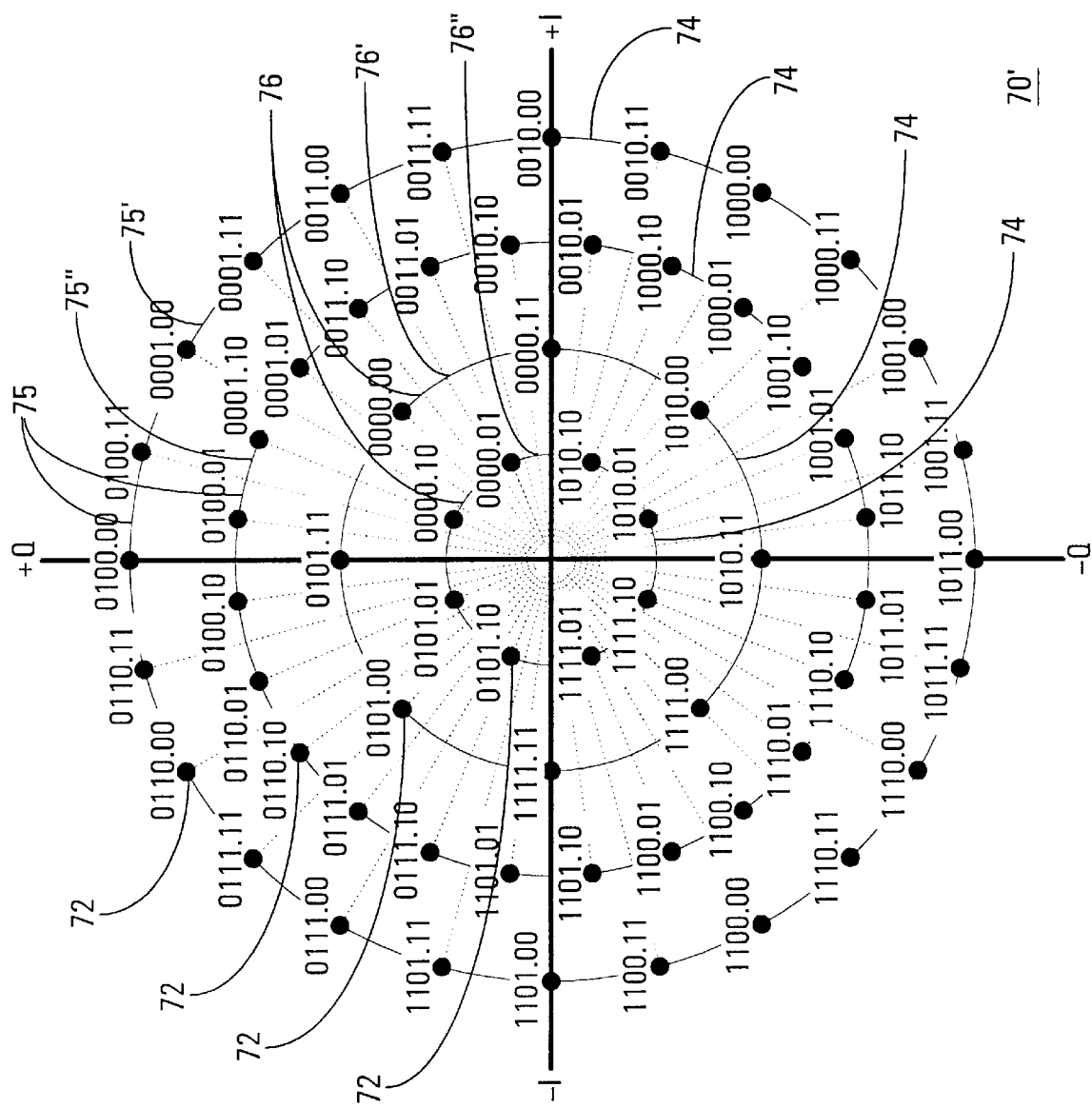
FIG. 5 shows a sixty-four phase-point, polar amplitude phase shift keyed fully-rotationally-invariant(sixty-four P-APSK-FRI) constellation produced by a second embodiment of the mapping circuit portion of the modulator shown in FIG. 3.

FIG. 5 shows a sixty-four phase-point, polar amplitude phase-shift keyed fully-rotationally-invariant (sixty-four P-APSK-FRI) constellation 70' produced by a second embodiment of mapping circuit 68. The following discussion refers to FIG. 5.

Constellation 70' is derived from a 12/4, sixteen P-APSK constellation (not shown) which is not well-suited to pragmatic encoding but which demonstrates desirable theoretical performance characteristics for uncoded or fully coded communications. Such a 12/4, sixteen P-APSK constellation (not shown) has an outer ring of twelve phase points arranged 30° apart from adjacent phase points, an inner ring of four phase points arranged 90° apart, implements a modulation order of four, and is used to communicate four symbols per unit interval.

Constellation 70' is derived from the 12/4, sixteen P-APSK constellation described above by providing four phase points 72 for each phase point in the original constellation. To do so, the two rings of the original constellation are expanded into a first (outer) ring pair 75 and a second (inner) ring pair 76, each of which has like numbers of phase points 72 per ring.

For first ring pair 75, the twelve-point outer ring of the original constellation becomes an outer ring 75', and an inner ring 75" is added. For outer ring 75', one phase point 72 is added for each of the twelve original phase points to achieve a total of twenty-four phase points 72. For inner ring 75", two phase points 72 are provided for each of the twelve original phase points on outer ring 75' to achieve a total of twenty-four phase points 72. All twenty-four phase points 72 on each of outer and inner rings 75' and 75" are uniformly distributed in phase, i.e., spaced 15° apart. Phase points 72 on inner ring 75" are symmetrically interleaved with phase points 72 on outer ring 75'. The phase angles of phase points 72 on inner ring 75" substantially bisect the phase angles of phase points 72 on outer ring 75', i.e., are rotated 7.5° with respect thereto.

For second ring pair 76, the four-point outer ring of the original constellation becomes an outer ring 76', and an inner ring 76" is added. For outer ring 76', one phase point 72 is added for each of the four original phase points to achieve a total of eight phase points 72. For inner ring 76", two phase points 72 are provided for each of the four original phase points on outer ring 76' to achieve a total of eight phase points 72. All eight phase points 72 on each of outer and inner rings 76' and 76" are uniformly distributed in phase, i.e., spaced 45° apart. Phase points 72 on inner ring 76" are symmetrically interleaved with phase points 72 on outer ring 76'. The phase angles of phase points 72 on inner ring 76" substantially bisect the phase angles of phase points 72 on outer ring 76', i.e., are rotated 22.5° with respect thereto.

Figure 6:
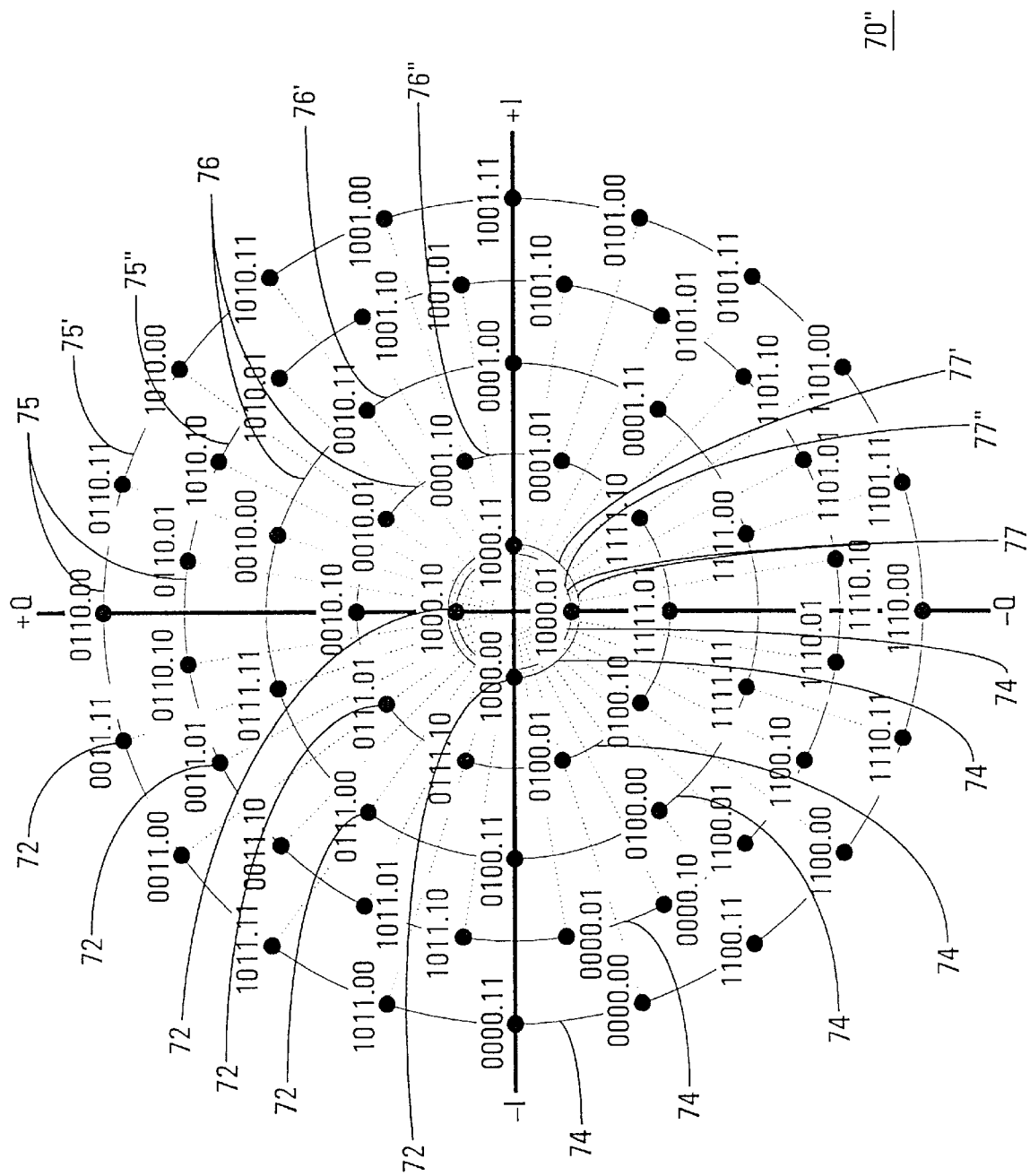
FIG. 6 shows a sixty-four phase point, polar amplitude phase-shift keyed non-fully-rotationally-invariant (sixty-four P-APSK-NFRI) constellation produced by a third embodiment of the mapping circuit portion of the modulator shown in FIG. 3.

FIG. 6 shows a sixty-four non-fully-rotationally-invariant polar amplitude phase-shift keyed (sixty-four P-APSK-NFRI) constellation 70" produced by a third embodiment of mapping circuit 68 (FIG. 3) in accordance with a preferred embodiment of the present invention. The following discussion refers to FIG. 6.

Constellation 70" is derived from a 10/5/1, sixteen P-APSK constellation (not shown) which is not well-suited to pragmatic encoding but which demonstrates desirable theoretical performance characteristics for uncoded or fully coded communications. Such a 10/5/1, sixteen P-APSK constellation (not shown) has an outer ring of ten phase points arranged 36° apart from adjacent phase points, an inner ring of five phase points arranged 72° apart, a central "ring" of one phase point, implements a modulation order of four, and is used to communicate four symbols per unit interval. However, practical implementation of such a 10/5/1 constellation typically suffers due to the presence of the single phase point at the origin of the I and Q axes. Such a zero-magnitude signal typically results in significant transmitter or amplifier distortion.

Constellation 70" is derived from the 10/5/1, sixteen P-APSK constellation described above by providing four phase points 72 for each phase point in the original constellation. To do so, the three rings of the 10/5/1, sixteen P-APSK constellation are expanded into a first (outer) ring pair 75, a second (intermediate) ring pair 76, and a third (central) ring pair 77, each of which has like numbers of phase points 72 per ring.

For first ring pair 75, the ten-point outer ring of the original constellation becomes an outer ring 75', and an inner ring 75" is added. For outer ring 75', one phase point 72 is added for each of the ten original phase points to achieve a total of twenty phase points 72. For inner ring 75", two phase points 72 are provided for each of the ten original phase points on outer ring 75' to achieve a total of twenty phase points 72. All twenty phase points 72 on each of outer ring 75' and inner ring 75" are uniformly distributed in phase, i.e., spaced 18° apart. Phase points 72 on inner ring 75" are symmetrically interleaved with phase points 72 on outer ring 75'. The phase angles of phase points 72 on inner ring 75" substantially bisect the phase angles of phase points 72 on outer ring 75', i.e., are rotated 9° with respect thereto.

For second ring pair 76, the five-point outer ring of the original constellation becomes an outer ring 76', and an inner ring 76" is added. For outer ring 76', one phase point 72 is added for each of the five original phase points to achieve a total of ten phase points 72. For inner ring 76", two phase points 72 are provided for each of the five original phase points on outer ring 76' to achieve a total of twenty phase points 72. All ten phase points 72 on each of outer ring 76' and inner ring 76" are uniformly distributed in phase, i.e., spaced 36° apart. Phase points 72 on inner ring 76" are symmetrically interleaved with phase points 72 on outer ring 76'. The phase angles of phase points 72 on inner ring 76" substantially bisect the phase angles of phase points 72 on outer ring 76', i.e., are rotated 18° with respect thereto.

For third ring pair 77, the single central phase point of the original constellation becomes an outer ring 77', and an inner ring 77" is added. For outer ring 77', one phase point 72 is added to the original phase point to achieve a total of two phase points 72. For inner ring 77", two phase points 72 are provided for the original phase point on outer ring 77' to achieve a total of two phase points 72. Both phase points 72 on each of outer ring 77' and inner ring 77" are uniformly distributed in phase, i.e., spaced 180° apart. Phase points 72 on inner ring 77" are symmetrically interleaved with phase points 72 on outer ring 77'. The phase angles of phase points 72 on inner ring 77" substantially bisect the phase angles of phase points 72 on outer ring 77', i.e., are rotated 90° with respect thereto.

Referring to FIGS. 4, 5, and 6, outer ring 75' in constellation 70, 70', or 70", has a maximum number of phase points 72 possible for the desired signal performance (discussed elsewhere). Each subsequent ring 74 inward has a number of phase points 72 either equal to the number of phase points 72 on the next-outward ring 74 or an integer factor thereof. Constellation 70 (FIG. 4) has one ring pair 75 in an 8/8 arrangement of phase points 72. Constellation 70' has two ring pairs 75 and 76 in a 24/24/8/8 arrangement of phase points 72, eight being an integer factor of twenty-four. Constellation 70" has three ring pairs 75, 76, and 77 in a 20/20/10/10/2/2 arrangement of phase points 72, ten being an integer factor of twenty and two being an integer factor of ten.

Where inner ring 75" of first (outer) ring pair 75 (referred to as more-outer ring 75" in this paragraph) is adjacent to outer ring 76' of second (inner) ring pair 76 (referred to as more-inner ring 76' in this paragraph), phase points 72 on more-outer ring 75" are symmetrically interleaved with phase points 72 on more-inner ring 76'. Since the number of phase points 72 on more inner ring 76' is an integer factor of the number of phase points on more-outer ring 75", not every adjacent pair of phase points 72 on more-outer ring 75" will have an interleaved phase point 72 on more-inner ring 76'. The phase angles of phase points 72 on more-inner ring 76' substantially bisect the phase angles of those adjacent phase points 72 on more-outer ring 75" that are so interleaved. A similar circumstance occurs in constellation 70" between inner ring 76" of second ring pair 76 and outer ring 77' of third ring pair 77.

Referring to FIGS. 4, 5, and 6, preferred labeling schemes are applied to phase points 72. The labeling schemes define primary and secondary sub-constellations. For constellations 70 and 70', the labeling schemes cooperate in achieving rotational invariance, which is discussed below.

The preferred labeling schemes are a set of binary codes in which a unique binary code is associated with each phase point 72. By applying the indicated binary code to inputs of mapping circuit 68 (FIG. 3), the indicated phase point is produced. Likewise, when receiver 40 (FIG. 2) receives a phase point near those phase points indicated in FIGS. 4, 5, and 6, PTCM demodulator 42 (FIG. 2) desirably generates data estimates corresponding to the indicated binary codes.

The preferred labeling schemes denote two bits to the right of a radix point and $2^{N-2}$ bits to the left of the radix point for each binary code, where N equals the modulation order. The modulation order is four for constellation 70 and six for constellations 70' and 70". The bits to the right of the radix point indicate encoded information bits 69, i.e., secondary information-bit stream 52, and the bits to the left of the radix point indicate uncoded information bits 51, i.e., primary information-bit stream 50. However, the radix point has no significance other than distinguishing encoded information bits 69 from uncoded information bits 51. Nothing requires encoded information bits 69 and uncoded information bits 51 to be in any particular order relative to each other. Rather, all encoded and uncoded information bits 69 and 51 are independent of each other. While encoded and uncoded information bits 69 and 51 for constellations 70, 70', and 70" are independent of each other, the resulting phase point symbols into which the information bits are mapped by mapping circuit 68 are not independent from one another in order to achieve desirable performance characteristics.

Figure 7:
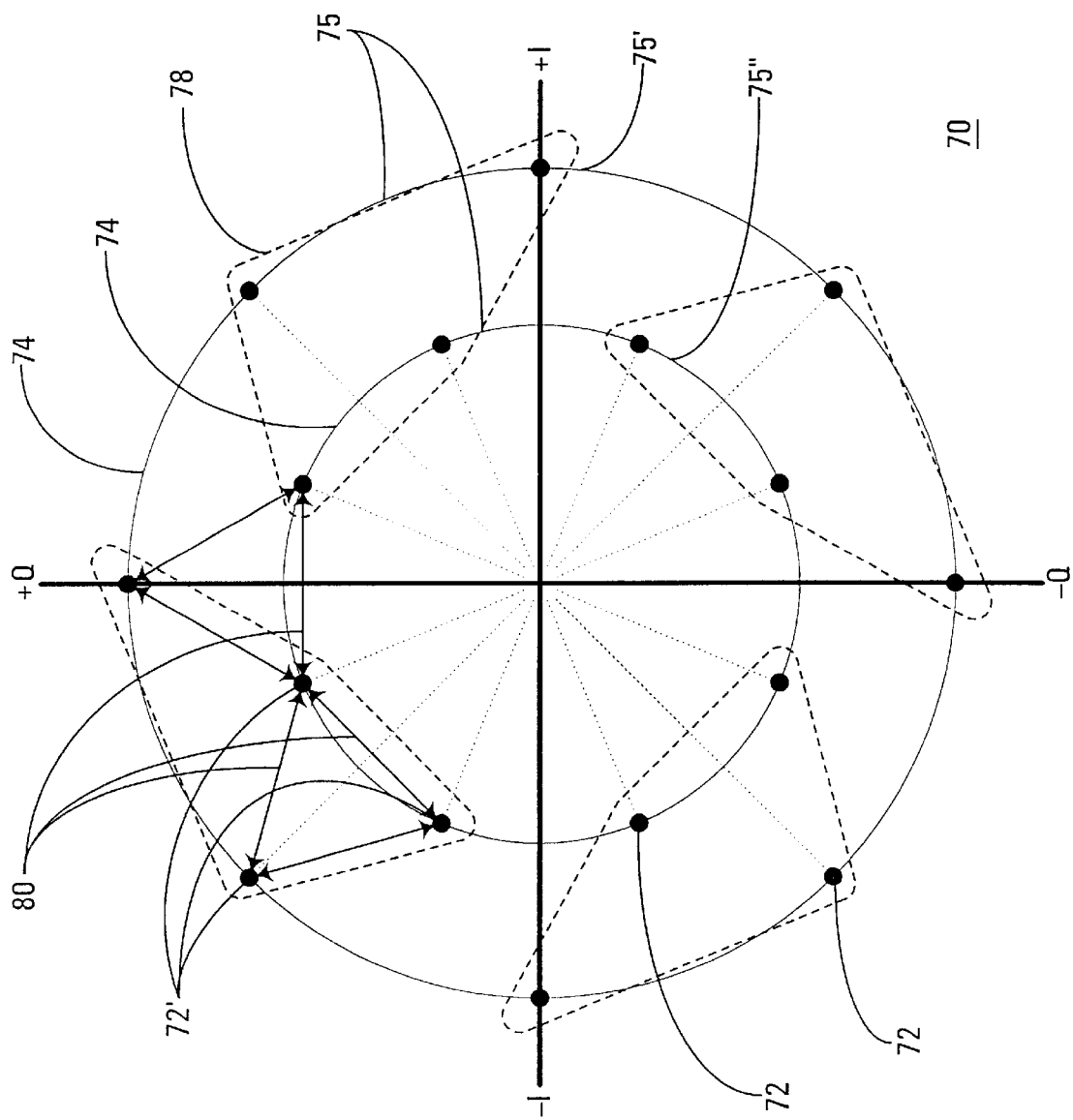
FIG. 7 shows the sixteen P-APSK-FRI constellation of FIG. 4 depicting secondary sub-constellations and minimum secondary Euclidean distances.
Figure 8:
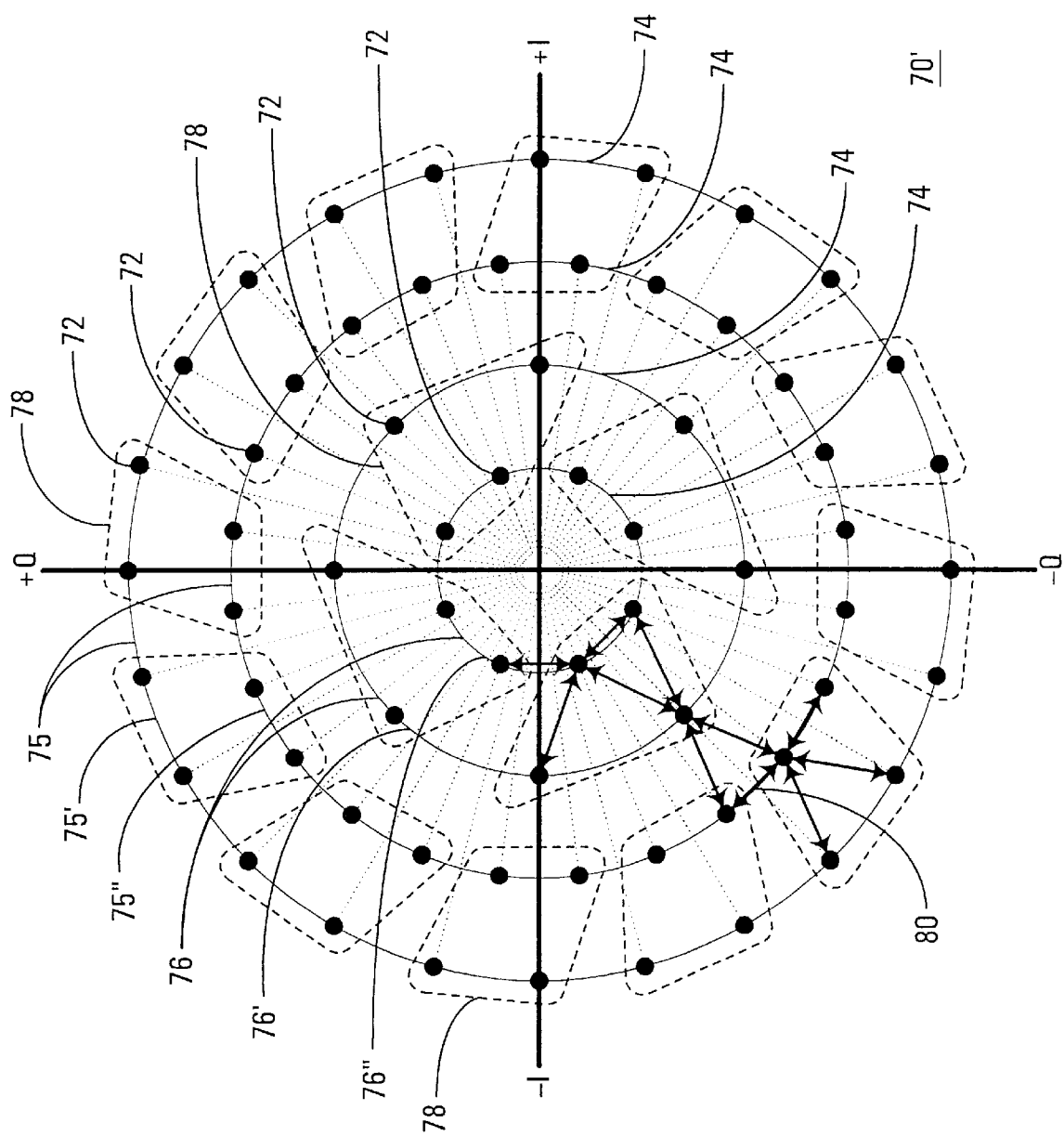
FIG. 8 shows the sixty-four P-APSK-FRI constellation of FIG. 5 depicting secondary sub-constellations and minimum secondary Euclidean distances.
Figure 9:
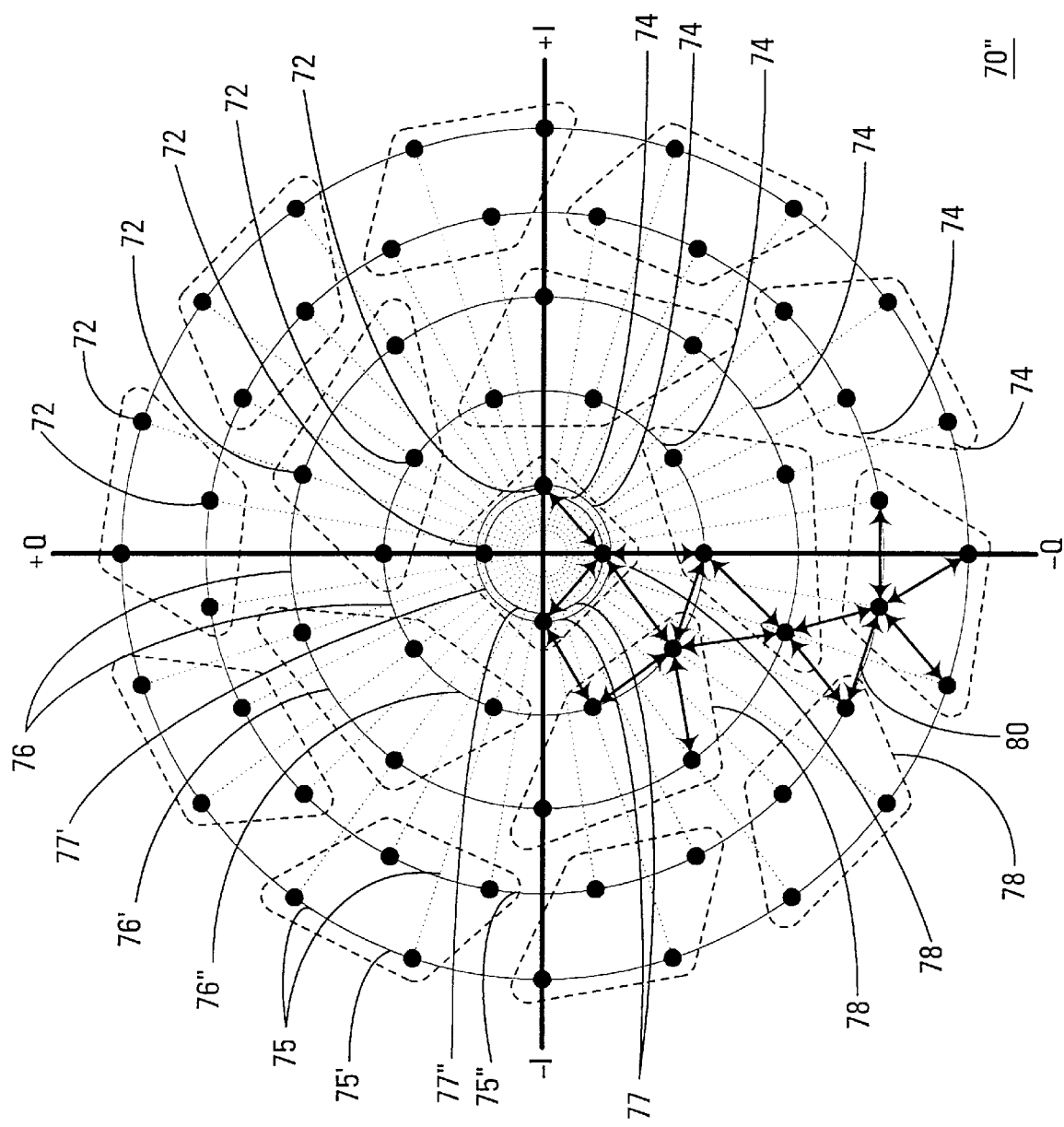
FIG. 9 shows the sixty-four P-APSK-NFRI constellation of FIG. 6 depicting secondary sub-constellations and minimum secondary Euclidean distances.

FIGS. 7, 8, and 9 show constellations 70, 70', and 70", respectively, of FIGS. 4, 5, and 6, respectively, depicting secondary sub-constellations and minimum secondary Euclidean distances in accordance with preferred embodiments of the present invention. FIGS. 7, 8, and 9 omit the labeling denoted in FIGS. 4, 5, and 6, respectively, for clarity, but this labeling defines the secondary sub-constellation groupings of phase points 72 and will be understood to apply to FIGS. 7, 8, and 9. The following discussion refers to FIGS. 4 through 9.

Each constellation 70, 70', or 70" has $2^{N-2}$ secondary sub-constellations 78, where N equals the modulation order. Desirably, phase points 72 are clustered together in secondary sub-constellations 78 so that secondary sub-constellations 78 do not overlap, though those skilled in the art will appreciate that this is not a requirement of sub-constellations 78. As a consequence of this, the center of each sub-constellation 78 is not centered at the origin of constellation 70, 70', or 70".

Secondary sub-constellations 78 are formed from those phase points 72 that have common data values for their uncoded information bits 51. Constellation 70, 70', and 70" have similar sub-constellation 78 features which lead to desirable performance characteristics. For example, the labeling applied to phase points 72 causes for each sub-constellation 78 to include two phase points 72 having a greater magnitude and two phase points 72 having a lesser magnitude. That is, for a given secondary sub constellation 78, two phase points 72 are located on outer ring 75', 76', or 77' and two phase points 72 on inner ring 75", 76", or 77" of ring pair 75, 76, or 77, respectively. For a given magnitude within each sub-constellation 78, one phase point 72 exhibits a first phase angle and another phase point 72 exhibits a second phase angle. These first and second phase angles differ from one another by the same offset angle. For constellation 70, that offset is 45° for phase points 72 on both outer ring 75' and inner ring 75" of ring pair 75. For constellation 70', that offset angle is 15° for phase points 72 on both outer ring 75' and inner ring 75" of first (outer) ring pair 75, and 45° for phase points 72 on both outer ring 76' and inner ring 76" of second (inner) ring pair 76. For constellation 70", that offset is 18° for phase points 72 on both outer ring 75' and inner ring 75" of first (outer) ring pair 75, 36° for phase points 72 on both outer ring 76' and inner ring 76" of second (intermediate) ring pair 76, and 180° for phase points 72 on both outer ring 77' and inner ring 77" of third (central) ring pair 77.

The phase angles of phase points 72 on outer ring 75', 76', or 77' of each given secondary sub-constellation 78 do not equal the phase angles of phase points 72 on inner ring 75", 76", or 77". In other words, the phase angles of phase points 72 on inner rings 75", 76", or 77" are offset relative to and substantially bisect the phase angles of phase points 72 on outer rings 75', 76', or 77', respectively, within each secondary sub-constellation 78. A benefit of this offset is improved performance achieved by spacing the inner-ring phase points 72 farther away from the outer-ring phase points 72.

However, the symbols or phase points produced by inputting independent encoded information bits 69 to mapping circuit 68 are dependent on one another. For example, the two encoded information bits 69 that drive mapping circuit 68 are responsible for identifying one of four possible phase points 72 within a sub-constellation 78 that has a given data value for uncoded information bits 51. This one-of-four possible phase points 72 will have a specific phase angle and magnitude. Neither of the two driving encoded information bits 69 exclusively controls the phase angle or magnitude parameter, or an I and Q parameter if represented in accordance with a rectilinear coordinate system, and the absolute distances between adjacent phase points 72 within a given sub-constellation 78 will differ depending upon which two adjacent phase points 72 are being evaluated. For example, adjacent phase points 72 on the outer ring are farther apart than adjacent phase points 72 on the inner ring.

In other words, there are $2^N$ phase points 72 in constellation 70, 70', or 70", where N is the order of magnitude (i.e., the number of information bits 30 (FIG. 3) mapped by mapping circuit 68 (FIG. 3) per unit interval of time 49 (FIG. 3). These $2^N$ information bits are divided into $2^{N-2}$ secondary sub-constellations 78, where each secondary sub-constellation 78 has four phase points sharing a common data value for uncoded information bits 51 (FIG. 3). Each of these constellation has $2^{N-2}$ secondary sub-constellations 78 with two phase points at a first magnitude (i.e., on outer ring 75', 76', or 77' of ring pair 75, 76, or 77, respectively), and, because of a possible exception of ring pair 77 (discussed later), at least no fewer than one less as many secondary sub-constellations 78, i.e., $(2^{N-2})-1$, with two phase points 72 at a second magnitude (i.e., on inner ring 75", 76", or 77" of ring pair 75, 76, or 77, respectively).

FIGS. 7, 8, and 9 indicate a selection of candidates for minimum secondary sub-constellation Euclidean distances 80. Minimum secondary sub-constellation Euclidean distances 80 represent the distances between adjacent or otherwise nearby phase points 72 in constellations 70, 70', and 70". Of course, constellations 70, 70', and 70" can be characterized as having numerous other Euclidean distances between phase points 72, but these minimum distances 80 are particularly influential in controlling performance. In this context, performance refers to the resulting error rate that results from operating at a given signal-to-noise ratio, modulation order, and effective coding rate. The smaller the minimum Euclidean distance 80, the worse the performance. However, this secondary modulation performance is compensated for by coding gain achieved through convolutional encoding. Accordingly, the code employed by convolutional encoding circuit 62 (FIG. 3) along with the relative magnitude of rings 74 for constellation 70, 70', or 70" define and establish the encoded-bit performance of system 20.

From a practical point of view, using ring pair 75 as an example, outer ring 75' should contain as many points as possible in keeping with the desired performance characteristic. Since inner ring 75" has the same number of phase points 72 as does outer ring 75', the distance between adjacent phase points 72 on inner ring 75" is minimum secondary Euclidean distance 80. To maximize performance, inner ring 75" should be as close as possible to outer ring 75' while maintaining the desired minimum secondary Euclidean distance 80. This occurs when phase points 72 on inner ring 75" are positioned so as to substantially bisect the phase angles of phase points 72 of outer ring 75 and the distance between phase points 72 on inner ring 75" and adjacent phase points 72 on outer ring 75' are substantially equal. That is, a phase-point triad 72' (FIG. 7), having two phase points 72 on inner ring 75" and one phase point 72 on outer ring 75', forms roughly an equilateral triangle. The same generalization holds true for second ring pair 76 (FIGS. 8 and 9).

Third ring pair 77 (FIG. 9) of constellation 70" poses a slightly different problem. Phase points 72 on outer third-pair ring 77' are interleaved between and bisect the phase angles of phase points 72 on inner second-pair ring 76" in a normal manner. The distance between either phase point 72 on outer third-pair ring 77' to either adjacent phase point 72 on inner second-pair ring 76" is approximately equal to minimum secondary Euclidean distance 80 and determines the position of outer third-pair ring 77' relative to inner second-pair ring 76".

Because phase points 72 on inner third-pair ring 77" are 90° away from phase points 72 on outer third-pair ring 77', phase points 72 on inner third-pair ring 77" are radially coincident to two of phase points 72 on inner second-pair ring 76". The distances between these coincident phase points 72 are also approximately equal to minimum secondary Euclidean distance 80, and determine the position of inner third-pair ring 77" relative to inner second-pair ring 76". This places outer and inner rings 77' and 77" in close proximity to each other. Since outer and inner rings 77' and 77" of third ring pair 77 are so close together, they may be thought of as a single elliptical ring (not shown) instead of as two circular rings 74. From this point of view, constellation 70" may be thought of as having a 20/20/10/10/4 phase-point configuration.

Minimum distances 80 are actually candidate distances because not all such distances actually need to be absolute minimum distances. As the relative magnitude of rings 74 changes, these distances change. As inner rings get larger relative to outer rings, then distances 80 between adjacent phase points 72 on the inner rings increase while distances 80 between adjacent phase points 72 on different rings decrease. If, for sixteen P-APSK-FRI example constellation 70, inner ring 75" has a magnitude approximately 65 percent of outer ring 75', then distances 80 between adjacent phase points on a common ring equal distances 80 between adjacent phase points 72 on adjacent rings. Desirably, several minimum distances 80 in constellation 70 are nearly equal, and distances 80 are as large as possible. This is typically achieved when the magnitude of inner ring 75" is in the range of 60–72 percent of the magnitude of outer ring 75'.

Figure 10:
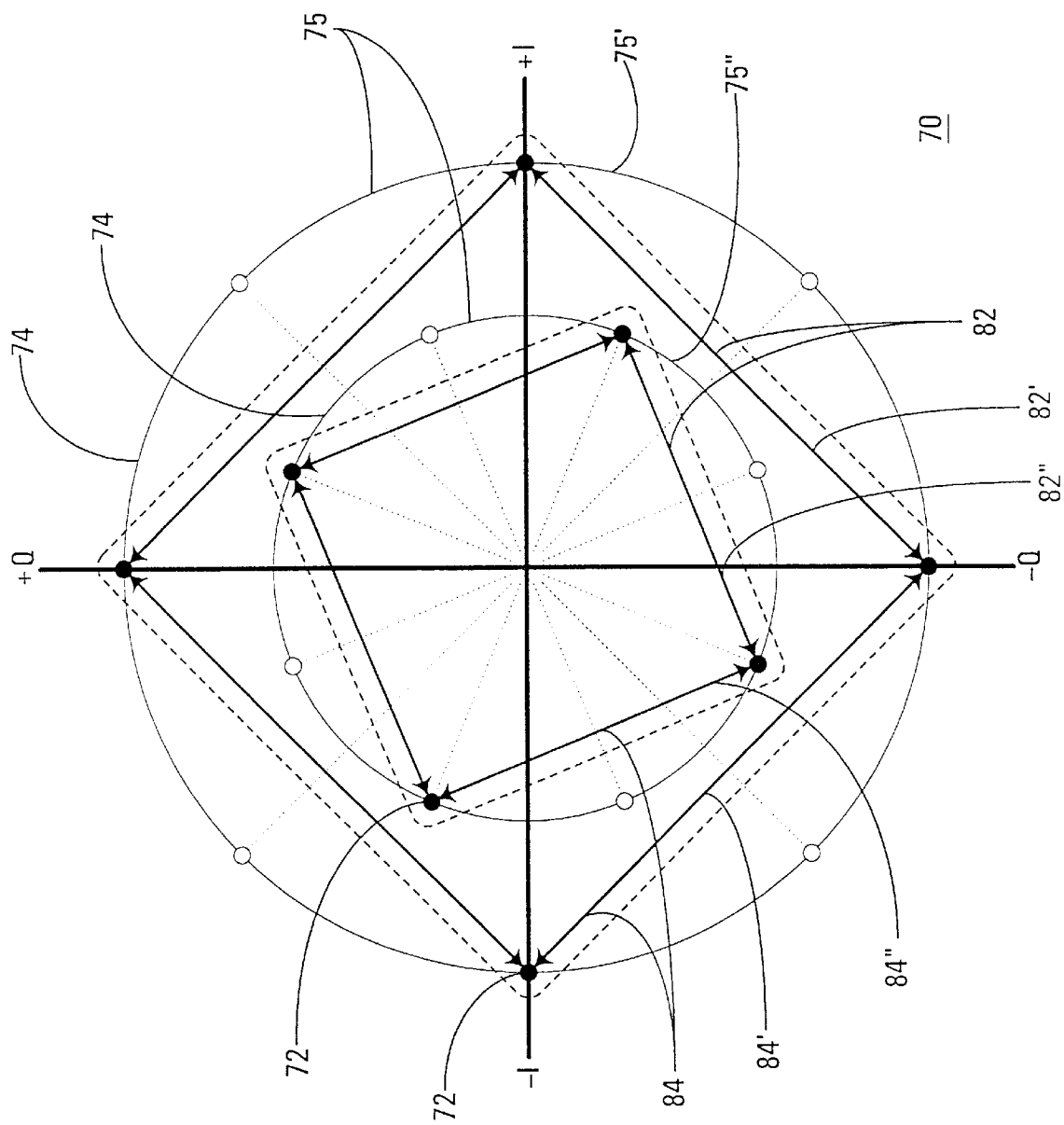
FIG. 10 shows the sixteen P-APSK-FRI constellation of FIG. 4 depicting primary sub-constellations $00_B$ and $01_B$, including minimum primary Euclidean distances therein.
Figure 11:
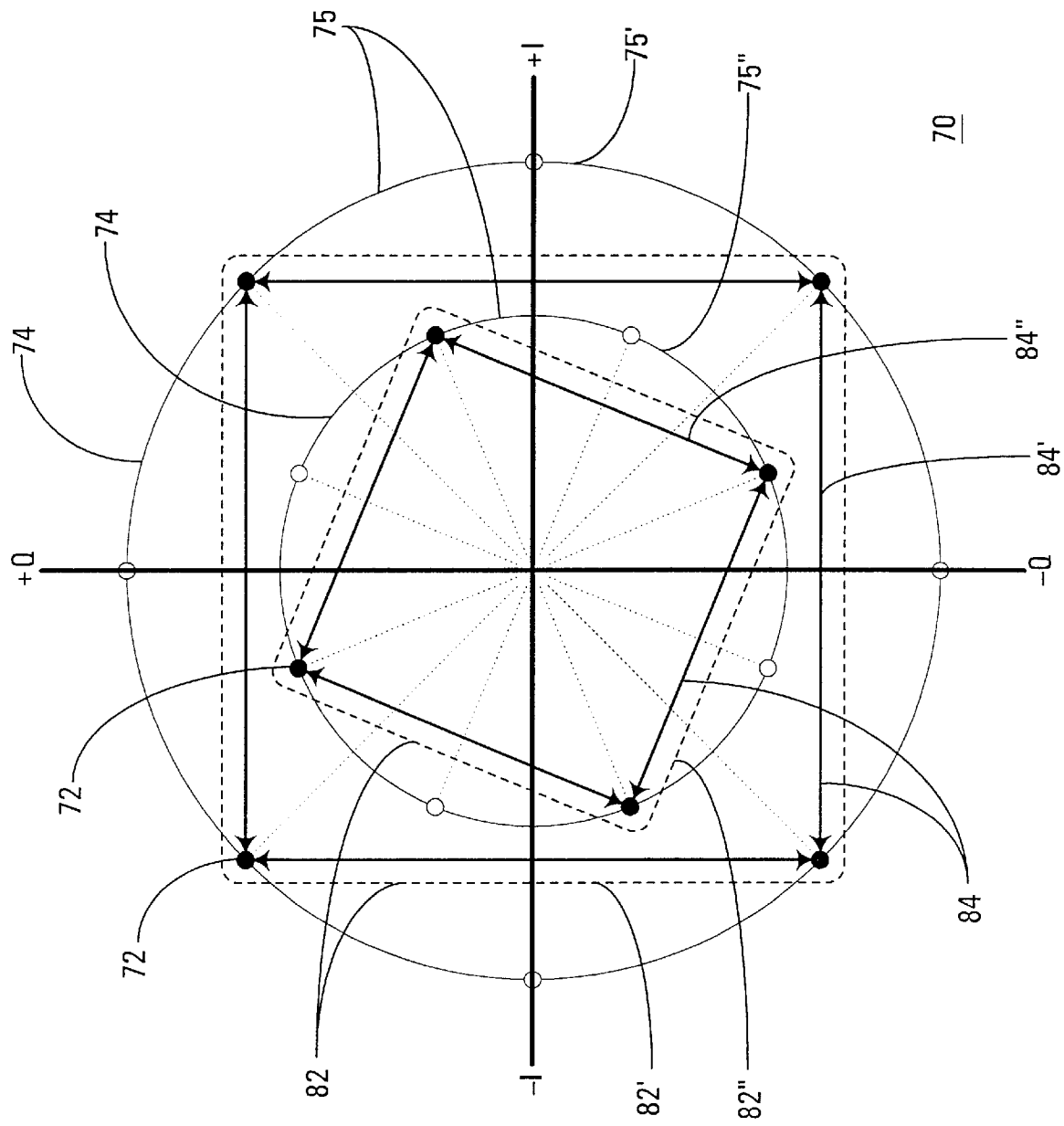
FIG. 11 shows the sixteen P-APSK-FRI constellation of FIG. 4 depicting primary sub-constellations $10_B$ and $11_B$, including minimum primary Euclidean distances therein.

FIGS. 10 and 11 show the sixteen P-APSK-FRI constellation 70 (FIG. 4), with each of FIGS. 10 and 11 depicting two primary sub-constellations 82. FIGS. 10 and 11 also illustrate various primary sub-constellation Euclidean distances 84 therein. The following discussion refers to FIGS. 4, 10, and 11.

Each of FIGS. 10 and 11 depict a single outer primary sub-constellation 82' and a single inner primary sub-constellation 82", with different primary sub-constellations 82 being depicted in FIGS. 10 and 11. Consequently, a total of four different primary sub-constellations 82 are collectively depicted in FIGS. 10 and 11. Primary sub-constellations 82 coexist with secondary sub-constellations 78 (FIGS. 7, 8, and 9) within a constellation implemented in mapping circuit 68 (FIG. 3). The different sub-constellations 78 and 82 reflect different groupings applied to the same sets of phase points 72 by a preferred labeling scheme that causes a P-APSK constellation to accommodate pragmatic coding.

For constellation 70, each of primary sub-constellations 82 encompasses those phase points 72 defined by like sets of encoded information bits 69 (FIG. 3). In the preferred labeling scheme, phase points 72 having like sets of encoded information bits 69 will have like digits to the right of the radix point (FIG. 4). Since there are two encoded information bits 69 for any given phase point, there are four sets of digits, being $00_B$, $01^B$, $10_B$, and $11_B$, as seen in FIG. 4.

As seen in FIGS. 10 and 11 for sixteen P-APSK-FRI constellation 70, each primary sub-constellation 82 resembles a square having vertices at phase points 72 spaced 90° apart at equal magnitudes. The four primary sub-constellations 82 are rotated multiples of 22.5° from one another, with phase points 72 of inner primary sub-constellations 82" being rotationally interspersed between phase points 72 of outer sub-constellations 82', bisecting the phase angles thereof.

Figure 12:
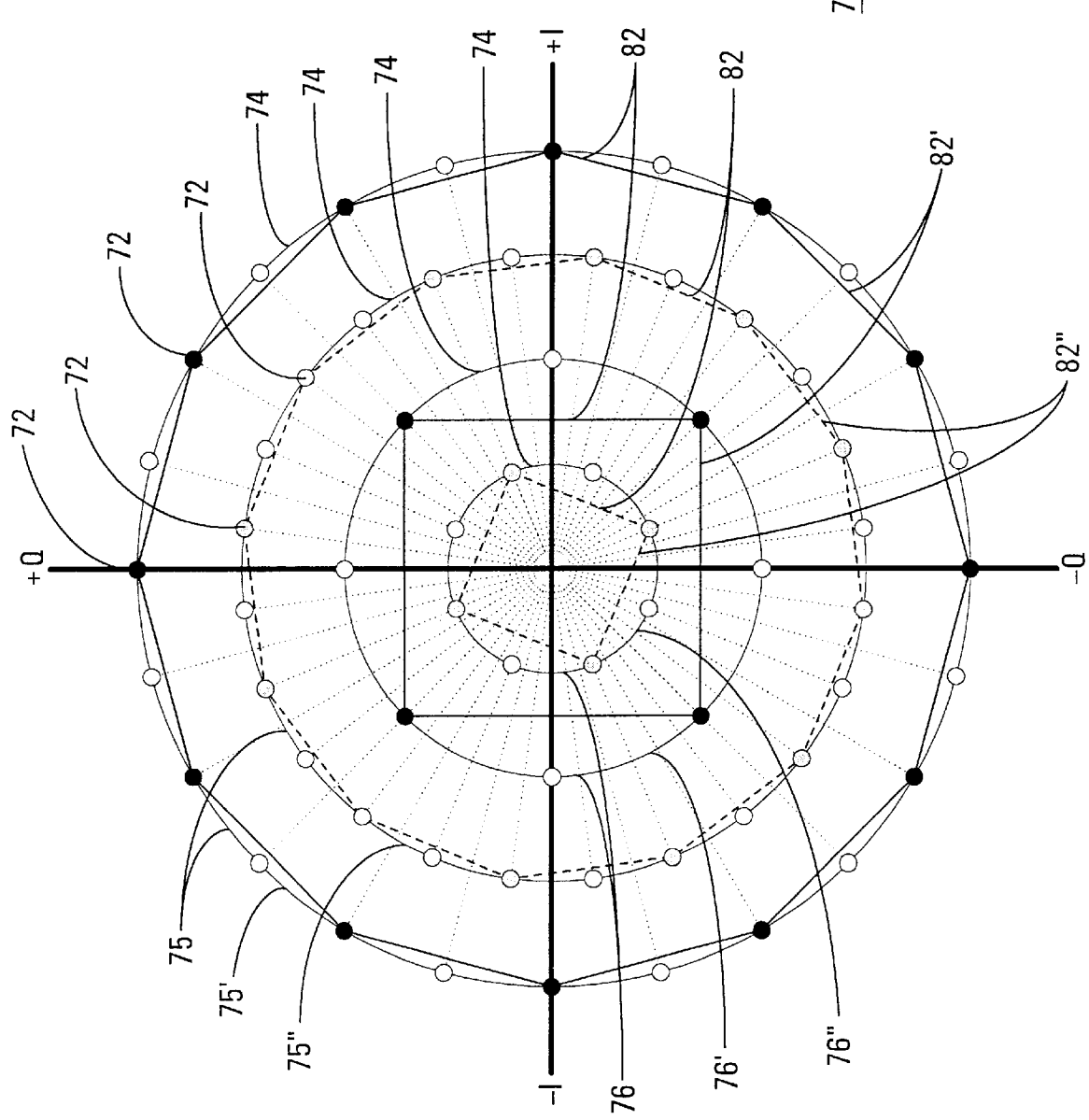
FIG. 12 shows the sixty-four P-APSK-FRI constellation of FIG. 5 depicting two of four primary sub-constellations.

Referring to FIGS. 5 and 12, FIG. 12 shows sixty-four P-APSK-FRI constellation 70' depicting two of four primary sub-constellations 82 in accordance with a preferred embodiment of the present invention. Each primary sub-constellation resembles a regular dodecagon encompassing a square. Outer primary sub-constellations 82' (only one of which is shown) have a dodecagon with vertices at phase points 72 spaced 30° apart on outer ring 75' of first (outer) ring pair 75, and a square with vertices at phase points 72 spaced 90° apart on outer ring 76' of second (inner) ring pair 76. Similarly, inner primary sub-constellations 82" (only one of which is shown) utilize inner rings 75" and 76", respectively. For each primary sub-constellation, phase points 72 of the squares are rotationally interspersed between pairs of phase points 72 of the dodecagons, bisecting the phase angles thereof. The four primary sub-constellations are rotated multiples of 7.5° from one another, with phase points 72 of the inner sub-constellations being rotationally interspersed between phase points 72 of the outer sub-constellations.

Figure 13:
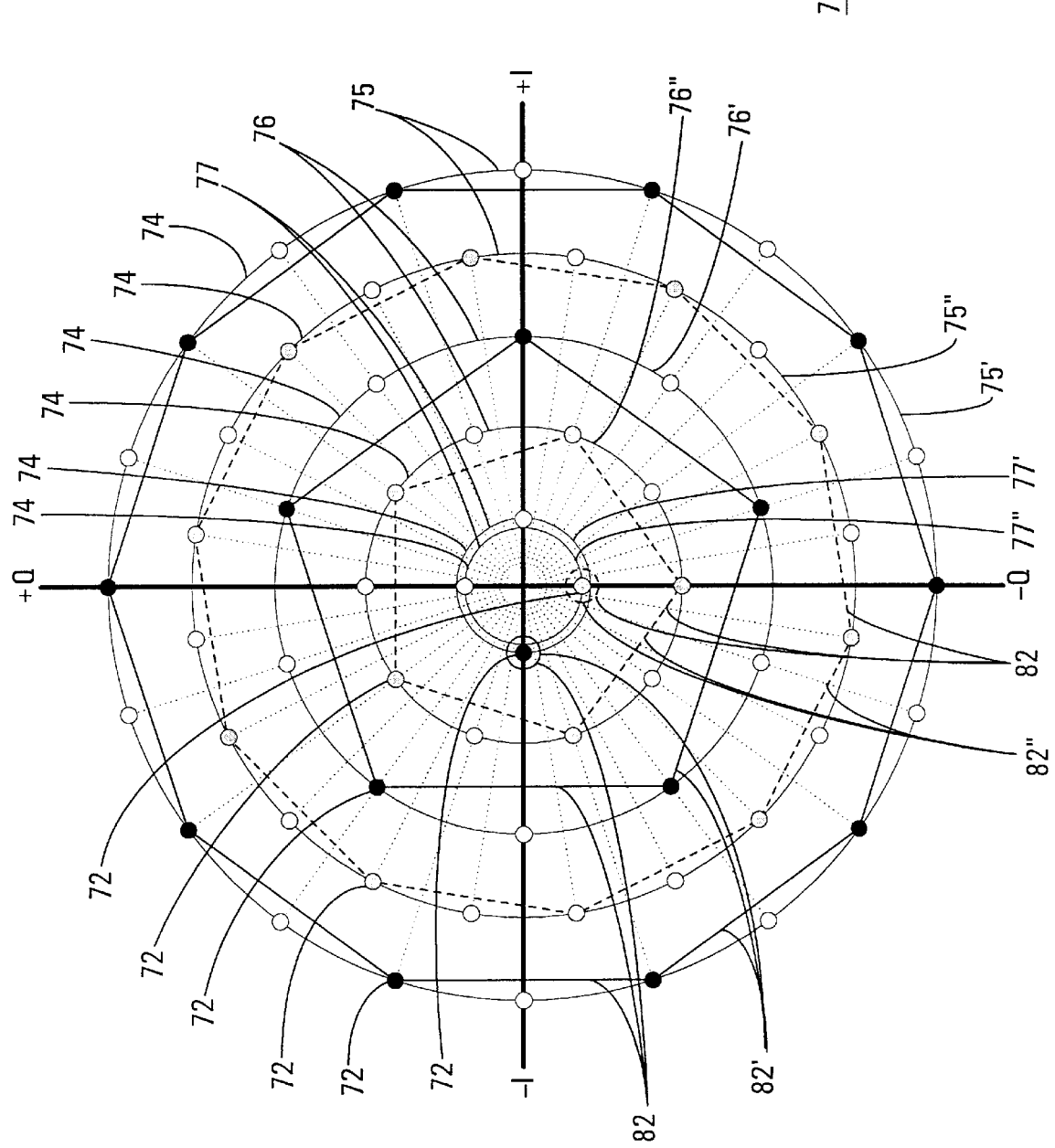
FIG. 13 shows the sixty-four P-APSK-NFRI constellation of FIG. 6 depicting two of four primary sub-constellations.

Referring to FIGS. 6 and 13, FIG. 13 shows sixty-four P-APSK-NFRI constellation 70" depicting two of four primary sub-constellations 82 in accordance with a preferred embodiment of the present invention. Each primary sub-constellation resembles a regular decagon encompassing a regular pentagon encompassing an offset point. Outer primary sub-constellations 82' (only one of which is shown) have a decagon with vertices at phase points 72 spaced 36° apart on outer ring 75' of first (outer) ring pair 75, a pentagon with vertices at phase points 72 spaced 72° apart on outer ring 76' of second (intermediate) ring pair 76, and an offset point at a single phase point 72 on outer ring 77' of third (central) ring pair 77. Similarly, inner primary sub-constellations 82" (only one of which is shown) utilize inner rings 75", 76", and 77", respectively. For each primary sub-constellation, phase points 72 of the pentagons are rotationally interspersed between pairs of phase points 72 of the decagons, bisecting the phase angles thereof, and the offset point is rotationally interspersed between a pair of phase points 72 of the pentagon, bisecting the phase angles thereof. The four primary sub-constellations are rotated multiples of 9° from one another, with phase points 72 of the inner sub-constellations being rotationally interspersed between phase points 72 of the outer sub-constellations.

Referring to FIGS. 4 through 13, each primary sub-constellation 82 includes those phase points 72 that have common data values for their encoded information bits 69. From the perspective of PTCM demodulator 42 (FIG. 2), when the data value of encoded information bits 69 has been resolved to a high degree of confidence, the specific primary sub-constellation 82 defined by this resolved data value for the encoded information bits 69 represents $2^{N-2}$ data values that are potentially expressed by the uncoded information bits 51 conveyed by the same phase point 72.

FIGS. 10 and 11 also show minimum primary sub-constellation Euclidean distances 84" for inner primary sub-constellations 82" and non-minimum primary sub-constellation Euclidean distances 84' for outer primary sub-constellations 82'. Non-minimum distances 84' are significantly larger than minimum distances 84". Accordingly, minimum distances 84", rather than non-minimum distances 84', exert a significant influence over the uncoded bit performance of constellation 70. As the magnitude of inner ring 75" increases, distances 84" increase, and the uncoded bit performance of constellation 70 improves. As discussed above, however, that improvement may come at the cost of a decrease in encoded bit performance. As the magnitude of inner ring 75" decreases, distances 84" decrease, and uncoded bit performance of constellation 70 deteriorates.

Figure 1:
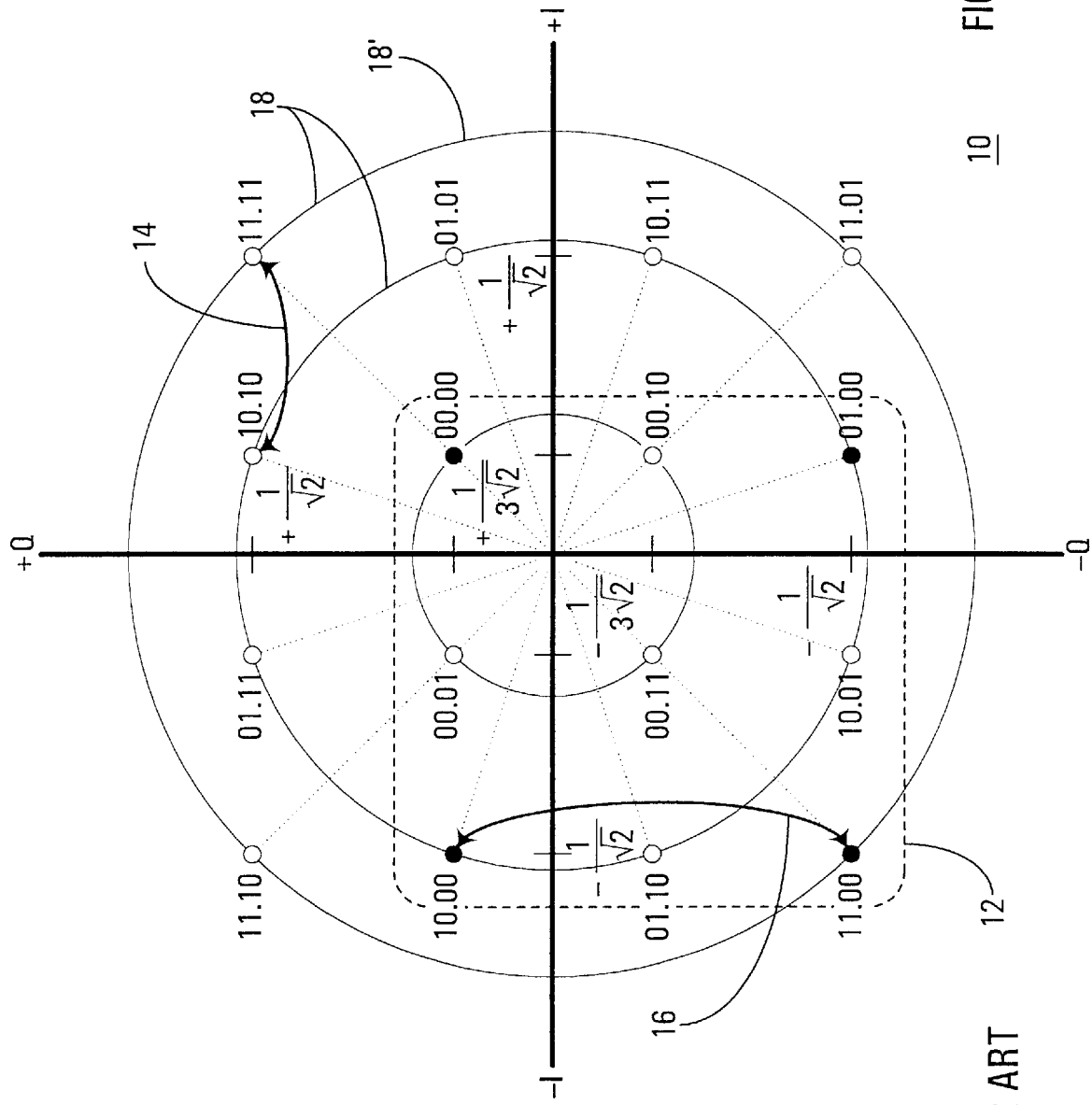
FIG. 1 shows a sixteen phase-point R-APSK constellation used in a prior art data communication system.

If the magnitude of inner ring 75" is set at 67 percent of the magnitude of the outer ring 75', distances 84" become precisely equal to minimum primary sub-constellation Euclidean distances 16 for conventional 16 R-APSK modulation (FIG. 1). However, unlike R-APSK modulations, fewer than one minimum primary sub-constellation Euclidean distance 84" per phase point 72 results from P-APSK constellations 70, 70', and 70", when the preferred constellation labeling scheme is used compared to one minimum primary sub-constellation Euclidean distance 16 (FIG. 1) per R-APSK phase point. In fact, only one-half of a minimum primary sub-constellation Euclidean distance 84" is provided per phase point 72 in preferred constellations 70, 70', and 70".

In other words, $2^N$ phase points 72 are grouped into each of four primary sub constellations 82, where N is the order of magnitude, i.e., the number of information bits 30 (FIG. 3) being mapped by mapping circuit 68 (FIG. 3) per unit interval of time 49 (FIG. 3). Of these $2^N$ phase points 72 per primary sub-constellation 82, $2^{N-2}$ have a common value for encoded information bits 69 (FIG. 3).

There are $2^N$ primary Euclidean distances 84 in a given constellation, which is equal to the number of phase points 72 within that constellation, i.e., sixteen for constellation 70, and sixty-four each for constellations 70' and 70". Since there are four primary sub-constellations 82, two of which are outer primary sub-constellations 82' and two of which are inner primary sub-constellations 82", and since minimum primary Euclidean distances 84" are inner primary Euclidean distances 84, there are less than $2^N$ minimum primary Euclidean distances (actually $2^N/2$) per constellation. This is in marked contrast to the prior art constellation 10 (FIG. 1) where there are sixteen phase points and sixteen minimum primary Euclidean distances.

For constellation 70 shown in FIGS. 10 and 11, a total of eight minimum primary sub-constellation Euclidean distances 84" exists. Consequently, other factors being equal, constellations 70, 70', and 70" exhibit improved performance over their R-APSK counterparts.

Referring back to FIG. 7, constellation 70 includes twenty-four candidates for minimum secondary sub-constellation Euclidean distance 80, which is the same number included in the corresponding prior art 16 R-APSK constellation 10 shown in FIG. 1. For comparison purposes, by operating the inner ring 74 at 67 percent of the magnitude of the outer ring 74, sixteen of these twenty-four distance candidates are only 2 percent less than the corresponding R-APSK minimum secondary sub-constellation Euclidean distances 14 (FIG. 1) while the remaining eight are 8 percent greater than the corresponding R-APSK minimum secondary sub-constellation Euclidean distances 14. As a result, when compared to a corresponding R-APSK constellation, operation of the inner ring 74 at 67 percent of the magnitude of the outer ring 74 yields improved performance.

However, those skilled in the art will appreciate that the present invention has no requirement that the inner ring 74 operate at precisely 67 percent of the magnitude of the outer ring 74. Rather, this 67 percent value is useful for comparison purposes with corresponding R-APSK constellations. In one preferred embodiment, a data set is loaded into mapping circuit 68 (FIG. 3) that establishes the magnitude of inner ring 74 relative to that of outer ring 74. This relative magnitude of rings 74 desirably causes uncoded bit performance to approximately equal coded bit performance at a given signal-to-noise ratio.

Referring back to FIGS. 3, 4, and 5, the preferred embodiment of PTCM modulator 28 is further configured to implement fully-rotationally-invariant P-APSK constellations 70 and 70'. Rotational invariance refers to an ability of receiver 40 (FIG. 2) to remain locked regardless of which of numerous potential phase points is currently being used by the receiver as a reference. This phenomenon is often referred to as a phase ambiguity. Differential encoding circuits 54 and 56 of PTCM modulator 28 support rotational invariance. Those skilled in the art will appreciate that differentially encoded data may be correctly and easily decoded whether or not it has been inverted.

In addition, the binary labeling scheme applied to constellations 70 and 70', for each subject phase point 72, there exists two adjacent phase points 72 on the same ring 74, each of which is labeled to have a data value for its encoded information bits 69 that is inverted from the data value for the encoded information bits 69 for the subject phase point 72, i.e., encoded information bits 69 of any two adjacent phase points 72 on the same ring 74 are mutually inverse in data value. As illustrated in FIGS. 4 and 7, a 45° offset, or any integer multiple thereof, in a phase reference for any secondary sub-constellation 78 causes encoded information bits 69 to become inverted from their true values. This inversion is easily compensated through differential decoding. As will be understood from the below-presented discussion, if encoded information bits 69 are detected in their inverted state, the resulting decisions regarding uncoded information bits 51 yield results that are likewise easily compensated through differential decoding. As further illustrated in FIGS. 4 and 7, a 90° offset, or any integer multiple thereof, in a phase reference for any secondary sub-constellation 78 results in a phase point 72 having the same data value for encoded information bits 69. For this situation the correct, non-inverted, encoded information bits 69 are recovered in receiver 40. Errors in uncoded information bits 51 due to the 90°, and integer multiples thereof, phase ambiguities are corrected through differential decoding in the receiver.

A combination of differential encoding, an appropriate labeling scheme, and an appropriate distribution of phase points 72 are required for a constellation to be fully rotationally invariant. In the preferred embodiments, constellations 70 and 70', when used with differential encoding circuits 54 and 56, are fully rotationally invariant. An advantage of full rotational invariance is a minimization in data stream interruption between the loss and regain of signal phase synchronization in receiver 40 (FIG. 2), e.g., with constellations 70 and 70', resynchronization is achieved in two unit intervals of time 49 after loss. The penalty is often some degradation in signal performance assuming all other parameters remain the same.

Without the use of differential encoding circuits 54 and 56, constellations 70 and 70' are not fully rotationally invariant. In such a case, the use of constellation 70" (FIG. 6) is preferred, as constellation 70" exhibits a marked increase in signal performance over constellations 70 and 70'. Without full rotational invariance, phase resynchronization after loss may take a multiplicity of unit intervals of time 49 after phase synchronization loss. Depending upon the type and criticality of data being communicated, such a time interval may be irrelevant. For example, in a digital television signal, this may represent only a fraction of a single scan line in a single frame, and, because of phosphor persistence, be virtually undetectable to the human eye.

The present invention has been described above with reference to preferred embodiments. However, those skilled in the art will recognize that changes and modifications may be made in these preferred embodiments without departing from the scope of the present invention. These and other changes and modifications which are obvious to those skilled in the art are intended to be included within the scope of the present invention.

What is claimed is:

1. A pragmatic trellis-coded modulator comprising:
   a parsing circuit configured to parse input information bits into uncoded information bits and to-be-coded information bits;
   a convolutional encoding circuit coupled to said parsing circuit and configured to produce at least two encoded information bits for each to-be-coded information bit processed therein per unit interval of time; and
   a polar amplitude phase shift keyed (P-APSK) mapping circuit coupled to said parsing circuit and said convolutional encoding circuit and configured to:
   accept at least two of said uncoded information bits from said parsing circuit per unit interval of time;
   accept at least two of said encoded information bits from said convolutional encoding circuit per unit interval of time;
   map said accepted uncoded and encoded information bits to a mapped phase point, said mapped phase point being one phase point within a constellation having a plurality of said phase points arranged in at least two concentric rings, the outermost pair of which possesses a like predetermined number of phase points per ring; and
   provide a quadrature signal defining said mapped phase point.

2. A pragmatic trellis-coded modulator as claimed in claim 1 wherein said P-APSK mapping circuit is configured to:
   accept an integer number "N" of said information bits per unit interval of time, N–2 of which are said uncoded information bits and two of which are said encoded information bits; and
   map said uncoded and encoded information bits to said mapped phase point within said constellation, said constellation having $2^N$ of said phase points.

3. A pragmatic trellis-coded modulator as claimed in claim 2 wherein:
   said $2^N$ phase points within said constellation are grouped into four primary sub-constellations;
   each of said primary sub-constellations includes $2^{N-2}$ of said phase points having a common data value for said encoded information bits;
   said $2^{N-2}$ phase points within each of said primary sub-constellations exhibit a plurality of Euclidean distances;
   a portion of said primary-sub-constellation Euclidean distances extends for a minimum primary-sub-constellation Euclidean distance; and
   said constellation has less than $2^N$ minimum primary-sub-constellation Euclidean distances.

4. A pragmatic trellis-coded modulator as claimed in claim 3 wherein said $2^N$ phase points are arranged so that said constellation has approximately $2^N/2$ minimum primary-sub-constellation Euclidean distances.

5. A pragmatic trellis-coded modulator as claimed in claim 2 wherein:
   said $2^N$ phase points are grouped into $2^{N-2}$ secondary sub-constellations within said constellation;
   each of said secondary sub-constellations has four phase points with a common data value for said uncoded information bits;
   each of said secondary sub-constellations has two phase points exhibiting a first magnitude; and
   at least $(2^{N-2})-1$ of said secondary sub-constellations have two phase points exhibiting a second magnitude which differs from said first magnitude.

6. A pragmatic trellis-coded modulator as claimed in claim 5 wherein, for each of said secondary sub-constellations:
   each of said first-magnitude phase points exhibits one of two phase angles;
   each of said second-magnitude phase points exhibits one of two phase angles; and
   said phase angles of said second-magnitude phase points differ from said phase angles of said first-magnitude phase points.

7. A pragmatic trellis-coded modulator as claimed in claim 6 wherein, for each of said secondary sub-constellations, a phase-angle difference between said phase angles of said first-magnitude phase points approximately equals a phase-angle difference between said phase angles of said second-magnitude phase points.

8. A pragmatic trellis-coded modulator as claimed in claim 2 wherein:
   said modulator additionally comprises a first differential encoding circuit coupled between said parsing circuit and said P-APSK mapping circuit;
   said modulator additionally comprises a second differential encoding circuit coupled between said parsing circuit and said convolutional encoding circuit;
   said constellation is a fully-rotationally-invariant constellation; and
   for each data value of said encoded information bits there exists four phase points of substantially the same magnitude and having substantially equal phase angles between adjacent ones of said four phase points.

9. A pragmatic trellis-coded modulator as claimed in claim 1 wherein said P-APSK mapping circuit is configured to:
   accept an integer number "N" of said information bits per unit interval of time, two of which are said encoded information bits and said constellation has $2^N$ of said phase points;
   associate each of said $2^N$ phase points with a data value for said encoded information bits; and
   position said $2^N$ phase points upon said concentric rings so that said data values of said encoded information bits for any two adjacent phase points upon each of said rings are mutually inverse.

10. A pragmatic trellis-coded modulator as claimed in claim 1 wherein:
    said P-APSK mapping circuit is configured to accept four of said information bits per unit interval of time, two of which are said uncoded information bits and two of which are said encoded information bits;
    said constellation has sixteen of said phase points;
    said constellation comprises one pair of said concentric rings, said one ring pair having an outer ring and an inner ring;
    each of said outer and inner rings comprises eight phase points having substantially equal phase angles between each pair of adjacent phase points; and
    each of said phase points within said inner ring has a phase angle substantially bisecting said phase angles of adjacent phase points in said outer ring.

11. A pragmatic trellis-coded modulator as claimed in claim 1 wherein:
    said P-APSK mapping circuit is configured to accept six of said information bits per unit interval of time, four of which are said uncoded information bits and two of which are said encoded information bits;
    said constellation has sixty-four of said phase points;
    said constellation comprises a first pair of said concentric rings and a second pair of said concentric rings within said first ring pair;
    each of said first and second ring pairs comprises an outer ring and an inner ring;
    for said first ring pair, each of said outer and inner rings comprises twenty-four phase points having substantially equal phase angles between each pair of adjacent phase points;
    for said second ring pair, each of said outer and inner rings comprises eight phase points having substantially equal phase angles between each pair of adjacent phase points; and
    for each of said first and second ring pairs, each of said phase points within said inner ring has a phase angle substantially bisecting said phase angles of adjacent phase points in said outer ring.

12. A pragmatic trellis-coded modulator as claimed in claim 1 wherein:
    said P-APSK mapping circuit is configured to accept six of said information bits per unit interval of time, four of which are said uncoded information bits and two of which are said encoded information bits;
    said constellation has sixty-four of said phase points;
    said constellation comprises a first pair of said concentric rings and a second pair of said concentric rings within said first ring pair;
    each of said first and second ring pairs comprises an outer ring and an inner ring;
    for said first ring pair, each of said outer and inner rings comprises twenty phase points having substantially equal phase angles between each pair of adjacent phase points;
    for said second ring pair, each of said outer and inner rings comprises ten phase points having substantially equal phase angles between each pair of adjacent phase points; and
    for each of said first and second ring pairs, each of said phase points within said inner ring has a phase angle substantially bisecting said phase angles of adjacent phase points in said outer ring.

13. A pragmatic trellis-coded modulator as claimed in claim 1 wherein:
    said constellation comprises a first pair of said adjacent concentric rings and a second pair of said adjacent concentric rings within said first ring pair;
    each of said first and second ring pairs comprises an outer ring and an inner ring;
    said inner and outer rings of said first ring pair possess a like number of phase points per ring;
    said inner and outer rings of said second ring pair possess a like number of phase points per ring, which number is an integer factor of said number of phase points per ring in said first ring pair; and
    each of said phase points within said outer ring of said second ring pair has a phase angle substantially bisecting said phase angles of adjacent phase points in said inner ring of said first ring pair.

14. A method for pragmatic trellis-code modulating a communications signal to produce a polar amplitude phase-shift keyed (P-APSK) quadrature signal communicating at a data rate of at least four symbols per unit interval of time, said method comprising the steps of:
    a) parsing information bits within said signal into, per unit interval of time, at least two uncoded information bits and at least one to-be-coded information bit;
    b) encoding, within a convolutional encoder, said to-be-coded information bits into two encoded information bits per to-be-coded information bit;
    c) accepting, into a P-APSK mapping circuit, N−2 of said uncoded information bits per unit interval of time where N is an integer number;
    d) accepting, into said P-APSK mapping circuit, two of said encoded information bits per unit interval of time;

e) mapping said accepted uncoded and encoded information bits to a mapped phase point, said mapped phase point being one phase point within a constellation having $2^N$ of said phase points arranged in at least two concentric rings, the outermost pair of which possesses a like predetermined number of phase points per ring; and f) obtaining, from said P-APSK mapping circuit, said quadrature signal defining said mapped phase point.

15. A modulating method as claimed in claim 14 wherein said mapping step e) comprises the steps of:

grouping said $2^N$ phase points within said constellation into four primary sub-constellations, wherein each of said primary sub-constellations has a unique set of $2^{N-2}$ phase points;

structuring each of said primary sub-constellations so that all phase points included in each primary sub-constellation have a common data value for said encoded information bits;

exhibiting, within each of said primary sub-constellations, a plurality of Euclidean distances among said $2^{N-2}$ phase points in said primary sub-constellations, wherein a portion of said Euclidean distances extend for a minimum primary-sub-constellation Euclidean distance; and assigning uncoded data values to said $2^N$ phase points so that said constellation has less than $2^N$ of said minimum primary-sub-constellation Euclidean distances.

16. A modulating method as claimed in claim 15 wherein said assigning step assigns said $2^N$ phase points so that said constellation has approximately $2^N/2$ of said minimum primary-sub-constellation Euclidean distances.

17. A modulating method as claimed in claim 14 wherein said mapping step e) comprises the steps of:

grouping said $2^N$ phase points within said constellation into $2^{N-2}$ secondary sub-constellations, wherein each of said secondary sub-constellations has a unique set of four phase points;

structuring each of said secondary sub-constellations so that all phase points included in each secondary sub-constellation have a common data value for said uncoded information bits;

exhibiting, within each of said secondary sub-constellations, two of said phase points at a first magnitude and at two differing phase angles;

exhibiting, within at least $(2^{N-2})-1$ of said secondary sub-constellations, two of said phase points at a second magnitude and at two differing phase angles;

defining said second-magnitude-phase-point phase angles to be different from said first-magnitude-phase-point phase angles; and establishing a phase-angle difference between said first-magnitude-phase-point phase angles to be approximately equal to a phase-angle difference between said second-magnitude-phase-point phase angles.

18. A modulating method as claimed in claim 14 wherein:

said method additionally comprises the step of differentially encoding, after said parsing step, said uncoded information bits into convolutionally uncoded information bits;

said method additionally comprises the step of differentially encoding, after said parsing step, said to-be-coded information bits into to-be-convolutionally-coded information bits;

said uncoded information bits accepted by said P-APSK mapping circuit are said convolutionally uncoded information bits;

said encoding step encodes said to-be-convolutionally-coded information bits into said encoded information bits; and said constellation is a fully-rotationally-invariant constellation.

19. A pragmatic trellis-coded modulator comprising:

a parsing circuit configured to parse input information bits into uncoded information bits and to-be-coded information bits;

a convolutional encoding circuit coupled to said parsing circuit and configured to produce at least two encoded information bits for each to-be-coded information bit processed therein per unit interval of time; and a polar amplitude phase shift keyed (P-APSK) mapping circuit coupled to said parsing circuit and said convolutional encoding circuit and configured to:

accept an integer number "N" of said information bits per unit interval of time, N–2 of which are said uncoded information bits and two of which are said encoded information bits;

map said accepted uncoded and encoded information bits to a mapped phase point, said mapped phase point being one phase point within a constellation having $2^N$ of said phase points arranged in at least two concentric rings, the outermost pair of which possesses a like predetermined number of phase points per ring;

associate each of said $2^N$ phase points with a data value for said encoded information bits;

position said $2^N$ phase points upon said concentric rings so that said encoded-information-bit data values for any two adjacent phase points upon each of said rings are mutually inverse; and provide a quadrature signal defining said mapped phase point.

* * * * *